(12) United States Patent
Takahashi

(10) Patent No.: US 10,683,230 B2
(45) Date of Patent: Jun. 16, 2020

(54) GAS BRANCHING APPARATUS AND METHOD FOR MANUFACTURING FINE GLASS PARTICLE DEPOSITED BODY USING THE SAME

(71) Applicant: FURUKAWA ELECTRIC CO., LTD., Tokyo (JP)

(72) Inventor: Tadashi Takahashi, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 166 days.

(21) Appl. No.: 15/621,446

(22) Filed: Jun. 13, 2017

(65) Prior Publication Data

US 2017/0275198 A1    Sep. 28, 2017

Related U.S. Application Data

(63) Continuation of application No. PCT/JP2016/000053, filed on Jan. 7, 2016.

(30) Foreign Application Priority Data

Jan. 8, 2015    (JP) .................................. 2015-002533
Jan. 8, 2015    (JP) .................................. 2015-002535
Jan. 8, 2015    (JP) .................................. 2015-002538

(51) Int. Cl.
*C03B 37/014* (2006.01)
*C03B 5/235* (2006.01)
(Continued)

(52) U.S. Cl.
CPC ........ *C03B 37/0142* (2013.01); *C03B 5/2356* (2013.01); *C03B 9/03* (2013.01);
(Continued)

(58) Field of Classification Search
CPC .......... C03B 37/0142; C03B 37/01413; C03B 37/02736; C03B 5/2356; C03B 9/03;
(Continued)

(56) References Cited

U.S. PATENT DOCUMENTS 4,938,789 A  *  7/1990  Tsuchiya ........... C03B 37/01413
                                                                118/692
5,540,059 A  *  7/1996  Yokokawa ........ C03B 37/01413
                                                                141/11

(Continued)

FOREIGN PATENT DOCUMENTS

CN       103803790 A       5/2014
JP       3-279234          12/1991
(Continued)

OTHER PUBLICATIONS

JP 2007176728 machine translation, Shimada et al., Burner Device and Method of Manufacturing Synthetic Quartz Glass Using the same, Jul. 12, 2007. (Year: 2007).*

(Continued)

*Primary Examiner* — Queenie S Dehghan
(74) *Attorney, Agent, or Firm* — Oblon, McClelland, Maier & Neustadt, L.L.P.

(57) ABSTRACT

A gas branching apparatus that branches and supplies a gas to first to N-th supply targets, includes first to N-th pipes wherein the first to N-th pipes are each branched into first to N-th branch pipes on a downstream end side, and wherein the i-th branch pipes of the respective first to N-th pipes are connected in common to the i-th supply target, and the i-th branch pipes of the respective first to N-th pipes are provided with valves, respectively, where i denotes each of integers of 1 to N.

6 Claims, 7 Drawing Sheets

(51) Int. Cl.
  *C03B 9/03* (2006.01)
  *C03B 37/027* (2006.01)
  *C23C 16/40* (2006.01)
  *C23C 16/453* (2006.01)

(52) U.S. Cl.
  CPC .. *C03B 37/01413* (2013.01); *C03B 37/02736* (2013.01); *C23C 16/402* (2013.01); *C23C 16/453* (2013.01); *C03B 2207/52* (2013.01); *C03B 2207/66* (2013.01); *C03B 2207/70* (2013.01); *C03B 2207/81* (2013.01); *C03B 2207/90* (2013.01); *F23N 2237/02* (2020.01)

(58) Field of Classification Search
  CPC ............ C03B 2207/52; C03B 2207/66; C03B 2207/70; C03B 2207/81; C03B 2207/90; C23C 16/402; C23C 16/453
  See application file for complete search history.

(56) References Cited

U.S. PATENT DOCUMENTS 6,152,166 A    11/2000   Bauscher et al.

2014/0099797 A1*  4/2014  Terasaki ................ C23C 16/402
                                                             438/787

FOREIGN PATENT DOCUMENTS

| JP | 8-284904    |   | 11/1996 |
|----|-------------|---|---------|
| JP | 10-57798    | A | 3/1998  |
| JP | 2003-89530  |   | 3/2003  |
| JP | 2004-26519  |   | 1/2004  |
| JP | 2007-176728 |   | 7/2007  |
| JP | 5090646     |   | 12/2012 |
| JP | 2013-249232 |   | 12/2013 |

OTHER PUBLICATIONS

International Search Report dated Mar. 8, 2016 in PCT/JP2016/000053 filed Jan. 7, 2016 (with English Translation).

Written Opinion dated Mar. 8, 2016 in PCT/JP2016/000053 filed Jan. 7, 2016.

Combined Chinese Office Action and Search Report dated Jun. 25, 2019 in corresponding Chinese Patent Application No. 201680005256.9 (with English Translation and English Translation of Category of Cited Documents) citing documents AO and AP therein, 12 pages.

* cited by examiner

GAS BRANCHING APPARATUS AND METHOD FOR MANUFACTURING FINE GLASS PARTICLE DEPOSITED BODY USING THE SAME

CROSS-REFERENCES TO RELATED APPLICATIONS

This application is a continuation application of International Application No. PCT/JP2016/000053, filed Jan. 7, 2016, which claims the benefit of Japanese Patent Applications No. 2015-002533, filed Jan. 8, 2015, No. 2015-002535, filed Jan. 8, 2015, and No. 2015-002538, filed Jan. 8, 2015. The contents of the aforementioned applications are incorporated herein by reference in their entireties.

FIELD

The present invention relates to a gas branching apparatus that branches and supplies a gas to a plurality of supply targets, and a method for manufacturing a fine glass particle deposited body using the same.

BACKGROUND

A quartz glass optical fiber is generally manufactured by forming an optical fiber base material called a preform and drawing the preform. In the manufacturing of a preform, a fine glass particle deposited body formed of an aggregate of fine glass particles is dehydrated and sintered by heating. As methods for manufacturing the glass particle deposited body, a vapor-phase axial deposition (VAD) method, an outside vapor deposition (OVD) method, and the like are known, for example.

In the OVD method, two or more burners are arranged around a long core material along a longitudinal direction of the core material, and a raw gas containing $SiCl_4$ and so on is supplied into oxyhydrogen flames generated by the burners. Thus, fine glass particles are generated and deposited on the core material to form a fine glass particle deposited body. Thereafter, the fine glass particle deposited body is dehydrated and sintered in a furnace to obtain a preform.

Regarding the aforementioned method for manufacturing a fine glass particle deposited body, Japanese Patent Application Laid-Open No. Hei 3-279234 discloses that gas conditions of burners arranged at equal intervals across the overall length of a glass rod are individually controlled such that the shape of the deposit can be equalized. Such control of the gas conditions of the respective burners uses mass flow controllers (MFCs) provided for the respective burners.

Moreover, Japanese Patent Application Laid-Open No. Hei 8-284904 and Japanese Patent Specification No. 5090646 describe the use of a flow divider and the like to branch a gas flow into a plurality of partial gas flows, in order to ensure that the gas is fed to the burners with high uniformity and reproducibility.

As in the case of the method for manufacturing a fine glass particle deposited body for optical fiber, a plurality of supply targets such as burners arranged along a longitudinal direction of an object such as a core material manufacture a product while being supplied with a gas such as a raw gas, a combustible gas, and a combustion-supporting gas, in some cases. In such a case, in order to ensure uniformity and stability of the manufactured product in the longitudinal direction, it is required to supply the gas with highest possible uniformity to the plurality of supply targets.

However, in the method using the MFCs provided for the respective supply targets as described in Japanese Patent Application Laid-Open No. Hei 3-279234, it is difficult to eliminate influences of aging changes in MFCs and of an individual difference among the MFCs.

Moreover, in the method using the flow divider as described in Japanese Patent Application Laid-Open No. Hei 8-284904 or Japanese Patent Specification No. 5090646, influences of processing accuracy of the flow divider itself are not negligible. Also, it is difficult to eliminate a resistance difference among pipes caused by an individual difference among the pipes. For this reason, even with the method using the flow divider, it is difficult to perfectly equally branch the gas.

SUMMARY

The present invention is made in consideration of the above problems, and has an object to provide a gas branching apparatus capable of supplying a gas into a plurality of supply targets with high uniformity, and a method for manufacturing a fine glass particle deposited body using the same.

According to one aspect of the present invention, there is provided a gas branching apparatus that branches and supplies a gas to first to N-th supply targets (where N is an integer of 2 or more), including: first to N-th pipes, wherein the first to N-th pipes are each branched into first to N-th branch pipes on a downstream end side, and wherein the i-th branch pipes of the respective first to N-th pipes are connected in common to the i-th supply target, and the i-th branch pipes of the respective first to N-th pipes are provided with respective valves, where i denotes each of integers of 1 to N.

According to another aspect of the present invention, there is provided a gas branching apparatus that branches and supplies a gas to first to N-th supply targets (where N is an integer of 2 or more), including: a plurality of flow dividers each including first to N-th gas outlets through which the gas is branched and discharged; and a plurality of pipes connecting one of the first to N-th gas outlets of each of the plurality of flow dividers to any of the first to N-th supply targets on a one-to-one basis, wherein the first to N-th gas outlets of each of the plurality of flow dividers are located at different positions in the flow divider, and wherein the plurality of gas outlets connected to the first to N-th supply targets, respectively, are located at the different positions in the flow dividers each other.

According to still another aspect of the present invention, there is provided a gas branching apparatus that branches and supplies a gas to first to N-th (where N is an integer of 2 or more) supply targets, including: a plurality of flow dividers each including first to N-th gas outlets through which the gas is branched and discharged, the flow dividers having different volumes; and a plurality of pipes connecting one of the first to N-th gas outlets of each of the plurality of flow dividers to any of the first to N-th supply targets on a one-to-one basis.

According to still another aspect of the present invention, there is provided a gas branching apparatus that branches and supplies a gas to first to N-th (where N is an integer of 2 or more) supply targets, including: a volume-variable flow divider including first to N-th gas outlets through which the gas is branched and discharged; and a plurality of pipes connecting one of the first to N-th gas outlets of the flow divider to any of the first to N-th supply targets on a one-to-one basis.

According to the present invention, a gas can be supplied to a plurality of supply targets with high uniformity.

DESCRIPTION OF EMBODIMENTS

[First Embodiment]

Figure 1:
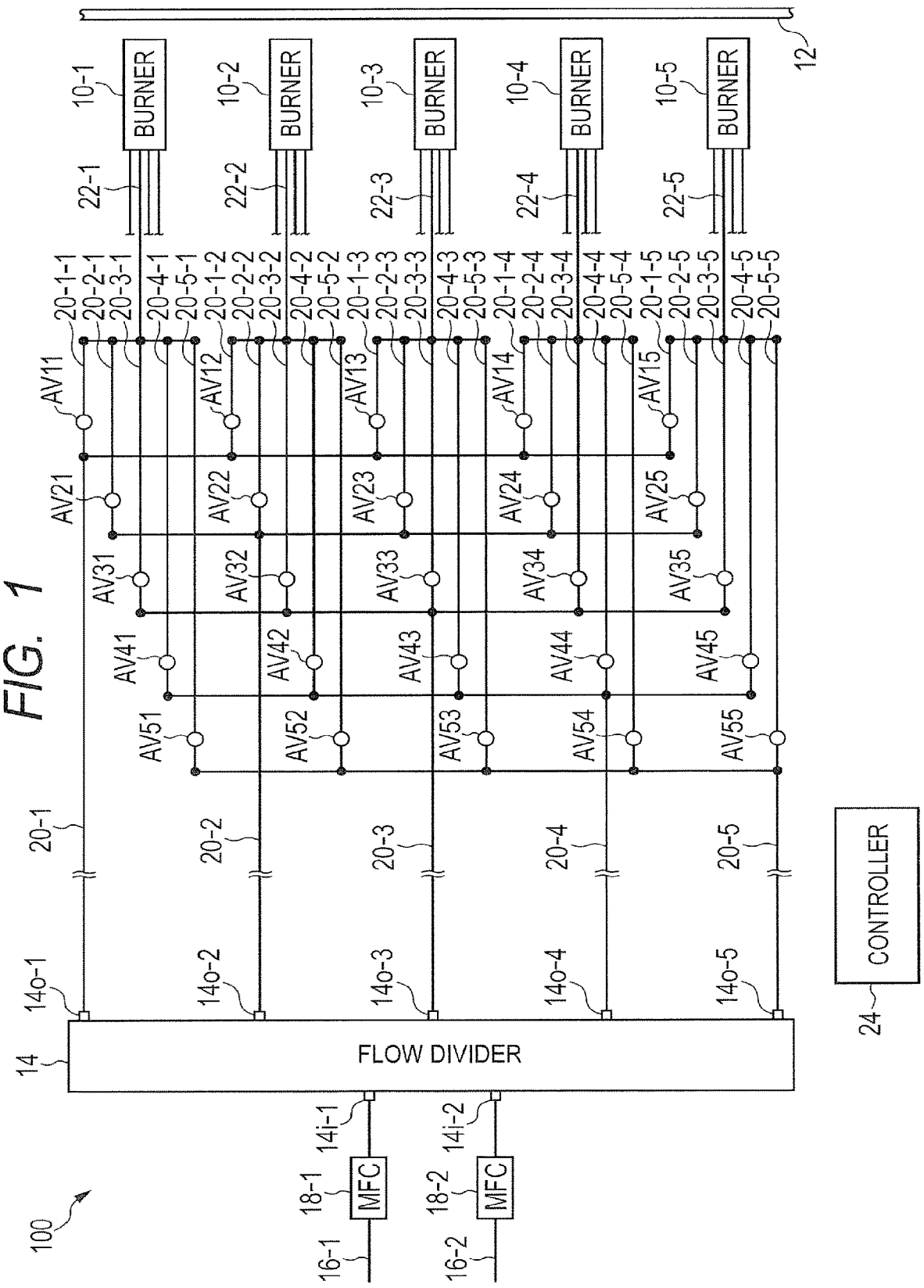
FIG. 1 is a schematic diagram showing a gas branching apparatus according to a first embodiment of the present invention.
Figure 2:
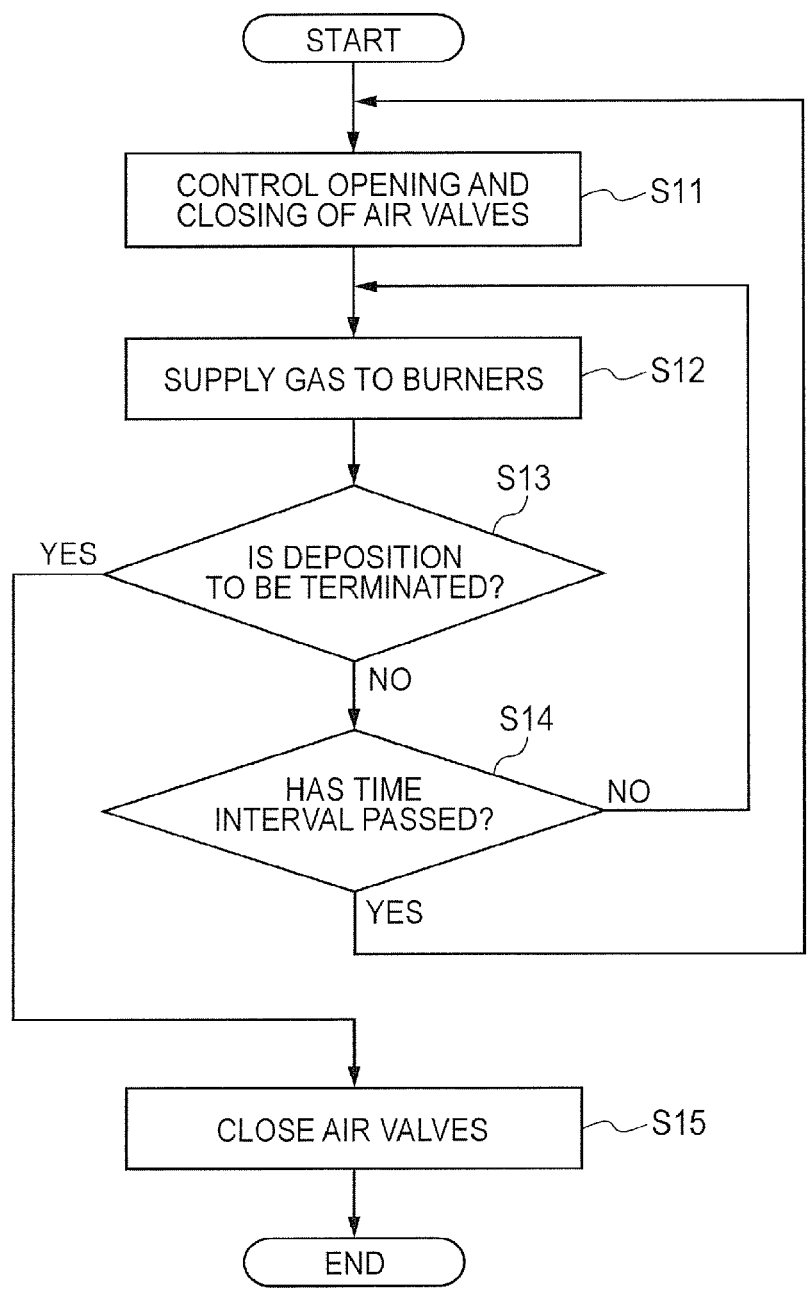
FIG. 2 is a flowchart showing operations of the gas branching apparatus according to the first embodiment of the present invention.

With reference to FIGS. 1 and 2, description is given of a gas branching apparatus according to a first embodiment of the present invention. FIG. 1 is a schematic diagram showing the gas branching apparatus according to this embodiment. FIG. 2 is a flowchart showing operations of the gas branching apparatus according to this embodiment.

First, with reference to FIG. 1, description is given of a configuration of the gas branching apparatus according to this embodiment.

As shown in FIG. 1, the gas branching apparatus 100 according to this embodiment branches and supplies a gas into a plurality of burners 10-1 to 10-5, which are supply targets to be supplied with the gas. Note that the following description is given of, as an example, the case where the burners 10-1 to 10-5 are burners for manufacturing a fine glass particle deposited body for optical fiber by use of the OVD method. Also, while the number of the burners is not particularly limited as long as two or more burners are provided, the following description is given of, as an example, the case where five burners 10-1 to 10-5 are used.

The burners 10-1 to 10-5 are made of quartz glass, for example, which are manufactured with the same design. Each of the burners 10-1 to 10-5 is supplied with a plurality of gases to form a flame and introduce a raw gas into the flame. The plurality of gases to be supplied to each of the burners 10-1 to 10-5 are, for example, hydrogen ($H_2$) gas, oxygen ($O_2$) gas, argon (Ar) gas, and raw gas. The raw gas includes $SiCl_4$ and the like. In the OVD method, for each of the burners 10-1 to 10-5, such gases are used to form an oxyhydrogen flame and the raw gas is introduced into the oxyhydrogen flame. Although flow rates of the respective gases to the burners 10-1 to 10-5 are not particularly limited, a flow rate of the $H_2$ gas is, for example, 20000 to 40000 sccm. A flow rate of the $O_2$ gas is, for example, 35000 to 40000 sccm. A flow rate of the Ar gas is, for example, 3000 to 5000 sccm. A flow rate of the raw gas is, for example, 3000 to 10000 sccm.

Note that the following description is given of, as an example, a configuration where one of the plurality of gases is supplied to each of the burners 10-1 to 10-5. However, a configuration where another gas is supplied to each of the burners 10-1 to 10-5 may also be the same as the configuration described below.

A long rod-shaped core material 12, onto which flames are blown from the burners 10-1 to 10-5, is a material on which fine glass particles are deposited to be a preform, and is a glass rod, for example. The core material 12 is held such that its longitudinal direction is horizontal. Also, the core material 12 is held so as to be rotatable with its central axis as a rotation axis. The length of the core material 12 is, for example, but not particularly limited to, several meters, more specifically, 1 to 2 m, for example.

The burners 10-1 to 10-5 are arranged in the horizontal direction at equal intervals along the longitudinal direction of the long rod-shaped core material 12. Note that while the description is given of, as an example, the case where the five burners 10-1 to 10-5 are provided in this embodiment, the number of burners to be arranged for the core material 12 having a length of 1 to 2 m, for example, can be set to 5 to 30. Thus, since the burners 10-1 to 10-5 are arranged at equal intervals, a plurality of flames from the burners 10-1 to 10-5 are blown toward the core material 12 at equal intervals.

Moreover, the burners 10-1 to 10-5 are configured to be movable back and forth within a predetermined range along the longitudinal direction of the core material 12. Note that the core material 12 may be configured to be movable back and forth along its longitudinal direction, instead of the burners 10-1 to 10-5 being configured to be movable back and forth.

The gas branching apparatus 100 according to this embodiment includes a flow divider 14 configured to branch a gas to be supplied to the plurality of burners 10-1 to 10-5. Also, the gas branching apparatus 100 according to this embodiment includes a piping system for supplying a gas to the flow divider 14 and a piping system for connecting between the flow divider 14 and the plurality of burners 10-1 to 10-5.

The flow divider 14 is made of metal, for example, and includes two gas inlets 14i-1 and 14i-2 and a plurality of gas outlets 14o-1 to 14o-5, which are the same in number as the plurality of burners 10-1 to 10-5. The plurality of gas outlets 14o-1 to 14o-5 are provided at equal intervals in a certain array direction. The flow divider 14 is disposed such that the array direction of the plurality of gas outlets 14o-1 to 14o-5 is horizontal as in the case of the longitudinal direction of the core material 12, for example.

Note that the volume of the flow divider 14 is, for example, but not particularly limited to, 1000 to 5000 cm$^3$, which can be selected according to gas supply conditions and the like. Moreover, while the description is given of the case where the flow divider 14 includes the two gas inlets 14i-1 and 14i-2, the number of the gas inlets is not limited to 2. The number of the gas inlets may be one or two or more, and can be changed as needed according to the volume of the flow divider 14, and the like.

The gas branching apparatus 100 according to this embodiment includes pipes 16-1 and 16-2 for supplying the flow divider 14 with the same kind of gas as that to be supplied to the burners 10-1 to 10-5. The pipes 16-1 and 16-2 have their upstream ends connected to a supply source (not shown) of the gas to be supplied to the burners 10-1 to 10-5. The pipes 16-1 and 16-2 are provided with MFCs 18-1 and 18-2, respectively. The MFCs 18-1 and 18-2 enable control of flow rates of gases flowing toward the flow divider 14 through the pipes 16-1 and 16-2.

The pipes 16-1 and 16-2 have their downstream ends connected to the two gas inlets 14i-1 and 14i-2 of the flow divider 14, respectively.

Moreover, the flow divider 14 is disposed upstream of a plurality of pipes 20-1 to 20-5. The pipes 20-1 to 20-5 have their upstream ends connected to the plurality of gas outlets 14o-1 to 14o-5 of the flow divider 14, respectively. The flow divider 14 is designed so as to have an equal branching ratio of the gas to the plurality of gas outlets 14o-1 to 14o-5. More specifically, the flow divider 14 is designed such that the gas introduced into the flow divider 14 through the pipes 16-1 and 16-2 is delivered into the pipes 20-1 to 20-5 with an equal branching ratio through the plurality of gas outlets 14o-1 to 14o-5.

The pipes 20-1 to 20-5 are each branched, at their downstream end side, into a plurality of branch pipes, which are the same in number as the plurality of burners 10-1 to 10-5. More specifically, the pipe 20-1 is branched into branch pipes 20-1-1 to 20-1-5 at its downstream end side. The pipe 20-2 is branched into branch pipes 20-2-1 to 20-2-5 at its downstream end side. The pipe 20-3 is branched into branch pipes 20-3-1 to 20-3-5 at its downstream end side. The pipe 20-4 is branched into branch pipes 20-4-1 to 20-4-5 at its downstream end side. The pipe 20-5 is branched into branch pipes 20-5-1 to 20-5-5 at its downstream end side.

The branch pipes of the pipes 20-1 to 20-5 are provided with air valves for opening and closing the branch pipes, respectively. More specifically, the branch pipes 20-1-1 to 20-1-5 are provided with air valves AV11, AV12, AV13, AV14, and AV15, respectively. The branch pipes 20-2-1 to 20-2-5 are provided with air valves AV21, AV22, AV23, AV24, and AV25, respectively. The branch pipes 20-3-1 to 20-3-5 are provided with air valves AV31, AV32, AV33, AV34, and AV35, respectively. The branch pipes 20-4-1 to 20-4-5 are provided with air valves AV41, AV42, AV43, AV44, and AV45, respectively. The branch pipes 20-5-1 to 20-5-5 are provided with air valves AV51, AV52, AV53, AV54, and AV55, respectively. Note that, in the following description, these air valves may be described as the air valves AVxy (where x is an integer that satisfies $1 \leq x \leq 5$ and y is an integer that satisfies $1 \leq y \leq 5$).

The branch pipes 20-1-1, 20-2-1, 20-3-1, 20-4-1, and 20-5-1, which are branched from different pipes from each other, have their downstream ends connected in common to an upstream end of a pipe 22-1. The branch pipes 20-1-2, 20-2-2, 20-3-2, 20-4-2, and 20-5-2, which are branched from different pipes from each other, have their downstream ends connected in common to an upstream end of a pipe 22-2. The branch pipes 20-1-3, 20-2-3, 20-3-3, 20-4-3, and 20-5-3, which are branched from different pipes from each other, have their downstream ends connected in common to an upstream end of a pipe 22-3. The branch pipes 20-1-4, 20-2-4, 20-3-4, 20-4-4, and 20-5-4, which are branched from different pipes from each other, have their downstream ends connected in common to an upstream end of a pipe 22-4. The branch pipes 20-1-5, 20-2-5, 20-3-5, 20-4-5, and 20-5-5, which are branched from different pipes from each other, have their downstream ends connected in common to an upstream end of a pipe 22-5.

The pipe 22-1 has its downstream end connected to the burner 10-1, so that the burner 10-1 is supplied with a gas through the pipe 22-1. The pipe 22-2 has its downstream end connected to the burner 10-2, so that the burner 10-2 is supplied with a gas through the pipe 22-2. The pipe 22-3 has its downstream end connected to the burner 10-3, so that the burner 10-3 is supplied with a gas through the pipe 22-3. The pipe 22-4 has its downstream end connected to the burner 10-4, so that the burner 10-4 is supplied with a gas through the pipe 22-4. The pipe 22-5 has its downstream end connected to the burner 10-5, so that the burner 10-5 is supplied with a gas through the pipe 22-5.

The gas branching apparatus 100 according to this embodiment further includes a controller 24 configured to control opening and closing of the air valves AVxy. The controller 24 includes a CPU (not shown) configured to execute various kinds of processing such as calculation, control, and determination. The controller 24 also includes a ROM (not shown) configured to store various control programs to be executed by the CPU, a database to be referred to by the CPU, and the like. The controller 24 further includes a RAM (not shown) configured to temporarily store data that is being processed by the CPU, input data, and the like.

The controller 24 controls opening and closing of the air valves AVxy so as to randomly switch between the opened and closed states of the air valves AVxy two or more times during manufacturing of the preform using the flames from the burners 10-1 to 10-5. As to switching between the opened and closed states of the air valves AVxy, the controller 24 controls opening and closing of the air valves AVxy so as to satisfy the following conditions (I) and (II).

(I) for x=1 to 5, one of the air valves AVx1, AVx2, AVx3, AVx4, and AVx5 is set to the opened state, and the rest are set to the closed state.

(II) for y=1 to 5, one of the air valves AV1y, AV2y, AV3y, AV4y, and AV5y is set to the opened state, and the rest are set to the closed state.

The controller 24 executes such switching between the opened and closed states of the air valves AVxy at predetermined time intervals. This time interval can be, but not particularly limited to, 1 to 10 minutes, for example.

During manufacturing of the fine glass particle deposited body, the switching between the opened and closed states of the air valves AVxy by the controller 24 described above allows the plurality of gas outlets 14o-1 to 14o-5 of the flow divider 14 to be connected to the plurality of burners 10-1 to 10-5 on a one-to-one basis. Furthermore, the gas outlets 14o-1 to 14o-5 of the flow divider 14 to be connected to the burners 10-1 to 10-5 are randomly switched.

In the gas branching apparatus 100 according to this embodiment, the flow divider 14 is designed so as to have an equal branching ratio of the gas to the plurality of gas outlets 14o-1 to 14o-5. Also, the pipes are designed so as to minimize a difference in pipe resistance from the plurality of gas outlets 14o-1 to 14o-5 to the burners 10-1 to 10-5. However, processing accuracy or aging changes may cause the branching ratio of the flow divider 14 to be not completely even. Moreover, processing accuracy or aging changes may cause a difference in pipe resistance from the plurality of gas outlets 14o-1 to 14o-5 to the burners 10-1 to 10-5. Furthermore, even though the burners 10-1 to 10-5 are manufactured with the same design, there is an individual difference thereamong due to the processing accuracy or aging changes. Thus, there are variations in members or parts due to the processing accuracy or aging changes, between the flow divider 14 and the burners 10-1 to 10-5. Such variations in members or parts make it difficult to supply the gas to the plurality of burners 10-1 to 10-5 with high uniformity. As a result, uniformity and stability of the fine glass particle deposited body in its longitudinal direction, which is manufactured along the longitudinal direction of the core material 12, may be impaired.

To counter this, in the gas branching apparatus 100 according to this embodiment, the switching between the opened and closed states of the air valves AVxy by the controller 24 randomly switches the gas outlets 14o-1 to 14o-5 of the flow divider 14 connected to the burners 10-1 to 10-5. Thus, such influences of the variations in members or parts due to the processing accuracy or aging changes as described above are canceled out. Accordingly, the influences of the variations in members or parts can be reduced. Therefore, according to this embodiment, the gas can be supplied to the plurality of burners 10-1 to 10-5 with high uniformity while reducing the influences of the variations in members or parts. This way, according to this embodiment, a fine glass particle deposited body excellent in uniformity and stability in the longitudinal direction can be manufactured. Moreover, even in the event of replacement of burners or pipes, the same gas supply state as that before the replacement can be reproduced with high reproducibility. Thus, a fine glass particle deposited body excellent in uniformity and stability in the longitudinal direction can be manufactured with high reproducibility.

Next, with reference to FIG. 2, description is further given of operations of the gas branching apparatus 100 according to this embodiment.

Before the gas branching apparatus 100 starts its operation, the air valves AVxy are all set in the closed state.

First, the gas branching apparatus 100 starts its operation, thereby introducing a gas into the flow divider through the pipes 16-1 and 16-2. During the introduction of the gas through the pipes 16-1 and 16-2, the MFCs 18-1 and 18-2 control the flow rates of the gases flowing through the pipes 16-1 and 16-2, respectively.

Next, the controller 24 controls opening and closing of the air valves AVxy (Step S11). Thus, the opened and closed states of the air valves AVxy are set to those that satisfy the above conditions (I) and (II). As for the control of opening and closing of the air valves AVxy, the controller 24 generates a random number or pseudo random number, for example, to select the air valve to be set to the opened state based on the generated random number or pseudo random number. Then, the controller 24 sets the selected air valve in the opened state and the rest in the closed state.

After setting the opened and closed states of the air valves AVxy as described above, gases are supplied to the plurality of burners 10-1 to 10-5, respectively (Step S12). Also, other gases used to manufacture a fine glass particle deposited body are similarly supplied to the plurality of burners 10-1 to 10-5.

In the respective burners 10-1 to 10-5 supplied with the gases as described above, flames are formed using a fuel gas among the gases supplied, and a raw gas among the gases supplied is introduced into the flames. Thus, the flames containing the raw material are blown onto the core material 12 rotated with its central axis as a rotation axis. Accordingly, fine glass particles to be a preform of optical fiber are sequentially deposited on the core material 12. Note that, in the meantime, the plurality of burners 10-1 to 10-5 may be moved back and forth along the longitudinal direction of the core material 12.

During the deposition of the fine glass particles on the core material 12 as described above, the deposition weight of the fine glass particles deposited on the core material 12 is monitored, and it is determined based on the monitored deposition weight whether or not to terminate the deposition of the fine glass particles (Step S13).

When the deposition weight of the fine glass particles is less than a predetermined weight and the deposition is continued rather than being terminated (Step S13, NO), it is determined whether or not a time interval for switching between the opened and closed states of the air valves AVxy has passed (Step S14).

When the time interval for switching between the opened and closed states of the air valves AVxy has not passed (Step S14, NO), the processing returns to Step S12 to continue the deposition of the fine glass particles while supplying the respective gases.

On the other hand, when the time interval for switching between the opened and closed states of the air valves AVxy has passed (Step S14, YES), the processing returns to Step S11 to again control opening and closing of the air valves AVxy by the controller 24. Thus, after randomly switching the opened and closed states of the air valves AVxy to those that satisfy the above conditions (I) and (II), the deposition of the fine glass particles is continued while supplying the respective gases. As for the control of opening and closing of the air valves AVxy, the controller 24 generates a random number or pseudo random number, for example, to select the air valve to be set to the opened state based on the generated random number or pseudo random number. Then, the controller 24 sets the selected air valve in the opened state and the rest in the closed state.

As described above, according to this embodiment, the random switching between the opened and closed states of the air valves AVxy by the controller 24 randomly switches the gas outlets 140-1 to 140-5 of the flow divider 14 connected to the burners 10-1 to 10-5. Thus, influences of variations in members or parts due to processing accuracy or aging changes can be reduced.

Note that it is preferable that the switching between the opened and closed states of the air valves AVxy is performed such that a cumulative time of times when the gases from the gas outlets 140-1 to 140-5 are supplied to the respective burners 10-1 to 10-5 is equal among the burners 10-1 to 10-5. Thus, the influences of the variations in members or parts due to processing accuracy or aging changes can be further reduced. As a result, the gases can be supplied to the plurality of burners 10-1 to 10-5 with higher uniformity.

On the other hand, when the deposition weight of the fine glass particles is the predetermined weight and thus the deposition is to be terminated (Step S13, YES), the controller 24 sets all the air valves AVxy in the closed state (Step S15). Thus, the deposition of the fine glass particles on the core material 12 is terminated to obtain a fine glass particle deposited body that is a deposition of the fine glass particles.

Thereafter, the fine glass particle deposited body thus obtained is dehydrated and sintered in a furnace to obtain a preform.

As described above, according to this embodiment, gases can be supplied to a plurality of supply targets with high uniformity.

[Second Embodiment]

A gas branching apparatus according to a second embodiment of the present invention is described. Note that the same constituent components as those in the gas branching apparatus according to the first embodiment described above are denoted by the same reference numerals, and description thereof is omitted or simplified.

In the first embodiment described above, the description is given of, as an example, the case where the opening and closing of the air valves AVxy are controlled so as to randomly switch between the opened and closed states of the air valves AVxy two or more times. However, the control of the opening and closing of the air valves AVxy is not limited to the case where the control is performed so as to randomly switch between the opened and closed states of the air valves AVxy two or more times. For example, the opening and closing of the air valves AVxy may be controlled so as to regularly switch between the opened and closed states of the air valves AVxy two or more times.

In this embodiment, description is given of the case where opening and closing of the air valves AVxy are controlled so as to regularly switch between the opened and closed states of the air valves AVxy two or more times.

In this case, for example, every time a predetermined time interval for switching between the opened and closed states of the air valves AVxy passes, opening and closing of the air valves AVxy in each of the following valve groups are synchronized and controlled as described below.

First, as for a valve group of the air valves AV11 to AV15, the air valve AV11, the air valve AV12, the air valve AV13, the air valve AV14, and the air valve AV15 are sequentially and repeatedly set to the opened state in this order. Meanwhile, the rest of the air valves other than the air valves set to the opened state are set to the closed state.

As for a valve group of the air valves AV21 to AV25, the air valve AV22, the air valve AV23, the air valve AV24, the air valve AV25, and the air valve AV21 are sequentially and repeatedly set to the opened state in this order. Meanwhile, the rest of the air valves other than the air valves set to the opened state are set to the closed state.

As for a valve group of the air valves AV31 to AV35, the air valve AV33, the air valve AV34, the air valve AV35, the air valve AV31, and the air valve AV32 are sequentially and repeatedly set to the opened state in this order. Meanwhile, the rest of the air valves other than the air valves set to the opened state are set to the closed state.

As for a valve group of the air valves AV41 to AV45, the air valve AV44, the air valve AV45, the air valve AV41, the air valve AV42, and the air valve AV43 are sequentially and repeatedly set to the opened state in this order. Meanwhile, the rest of the air valves other than the air valves set to the opened state are set to the closed state.

As for a valve group of the air valves AV51 to AV55, the air valve AV55, the air valve AV51, the air valve AV52, the air valve AV53, and the air valve AV54 are sequentially and repeatedly set to the opened state in this order. Meanwhile, the rest of the air valves other than the air valves set to the opened state are set to the closed state.

As described above, the opening and closing of the air valves AVxy can also be controlled so as to regularly switch two or more times between the opened and closed states of the air valves AVxy to those that satisfy the above conditions (I) and (II). Such regular switching between the opened and closed states of the air valves AVxy regularly switches the gas outlets 14*o*-1 to 14*o*-5 of the flow divider 14 connected to the burners 10-1 to 10-5. Thus, such regular switching can also reduce influences of variations in members or parts due to processing accuracy or aging changes. Therefore, according to this embodiment, the gases can be supplied to the plurality of burners 10-1 to 10-5 with high uniformity while reducing the influences of the variations in members or parts.

Note that, in this case, again, it is preferable that the switching between the opened and closed states of the air valves AVxy is performed such that a cumulative time of times when the gases from the gas outlets 14*o*-1 to 14*o*-5 are supplied to the respective burners 10-1 to 10-5 is equal among the burners 10-1 to 10-5.

The present invention is not limited to the first and second embodiments described above, but various modifications can be made thereto.

For example, in the first and second embodiments, the description is given of, as an example, the case where the gas is branched and supplied into the five burners 10-1 to 10-5. However, the number of the burners is not particularly limited as long as two or more burners are provided.

When a gas is branched and supplied into first to N-th (where N is an integer of 2 or more) burners, the flow divider includes first to N-th gas outlets through which the gas is discharged, and is designed so as to have an equal branching ratio of the gas to the first to N-th gas outlets. Also, it is assumed that upstream ends of first to N-th pipes are connected to the first to N-th gas outlets, respectively. Moreover, the first to N-th pipes are each branched into first to N-th branch pipes at their downstream end side. Furthermore, the i-th branch pipes of the respective first to N-th pipes are connected in common to the i-th burner, and the i-th branch pipes of the respective first to N-th pipes are provided with valves, respectively, where i denotes each of integers of 1 to N.

When the gas is branched and supplied to the first to N-th burners, the controller may control opening and closing of the valves so as to satisfy the following first and second conditions. More specifically, the first condition is that one of N valves provided on the first to N-th branch pipes of the j-th pipe is set to the opened state, and the rest are set to the closed state, where j denotes each of integers of 1 to N. The second condition is that one of N valves provided on the k-th branch pipes of the respective first to N-th pipes is set to the opened state, and the rest are set to the closed state, where k denotes each of integers of 1 to N.

Moreover, in the first and second embodiments, the description is given of, as an example, the case where the burners 10-1 to 10-5 are used as a plurality of supply targets to be supplied with the gas. However, the supply targets are not limited to the burners. The supply targets may be those subjected to some kind of processing, such as manufacturing of products and processing on processed products, using the supplied gas.

Moreover, in the first and second embodiments, the description is given of, as an example, the case where the burners 10-1 to 10-5 as the supply targets are arranged along the longitudinal direction of the core material 12 that is a long object. However, the plurality of supply targets do not always have to be those arranged along the longitudinal direction of the object.

Moreover, in the first and second embodiments, the description is given of, as an example, the case using the air valves AVxy. However, instead of the air valves, various valves can be used, whose opening and closing can be controlled by the controller 24. For example, electromagnetic valves or the like can be used instead of the air valves.

Moreover, in the first and second embodiments, the description is given of, as an example, the case where the core material 12 is held such that the longitudinal direction thereof is horizontal. However, the mode of holding the core material 12 is not limited thereto. For example, the core material 12 may be held such that the longitudinal direction thereof is vertical. In this case, the burners 10-1 to 10-5 can be arranged at equal intervals along the longitudinal direction of the core material 12 that is vertically disposed. Moreover, the flow divider 14 may be disposed such that the array direction of the plurality of gas outlets 14*o*-1 to 14*o*-5 is horizontal, as in the above case, or can also be disposed such that the array direction of the plurality of gas outlets 140-1 to 140-5 is vertical.

Moreover, the first and second embodiments are also applicable to the case where no flow divider is used or where the branching ratio of the flow divider is not even.

[Third Embodiment]

Figure 3:
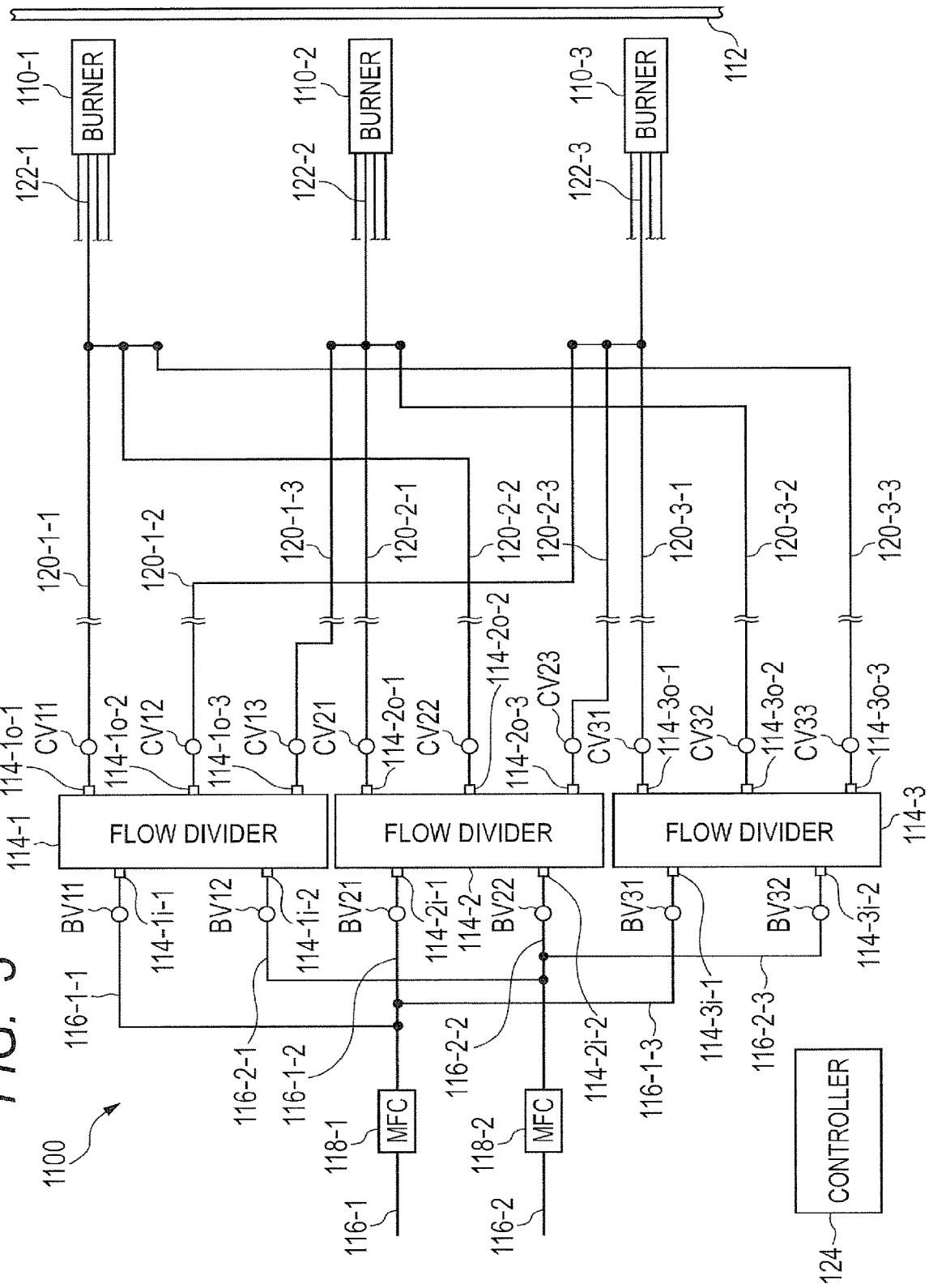
FIG. 3 is a schematic diagram showing a gas branching apparatus according to a third embodiment of the present invention.
Figure 4:
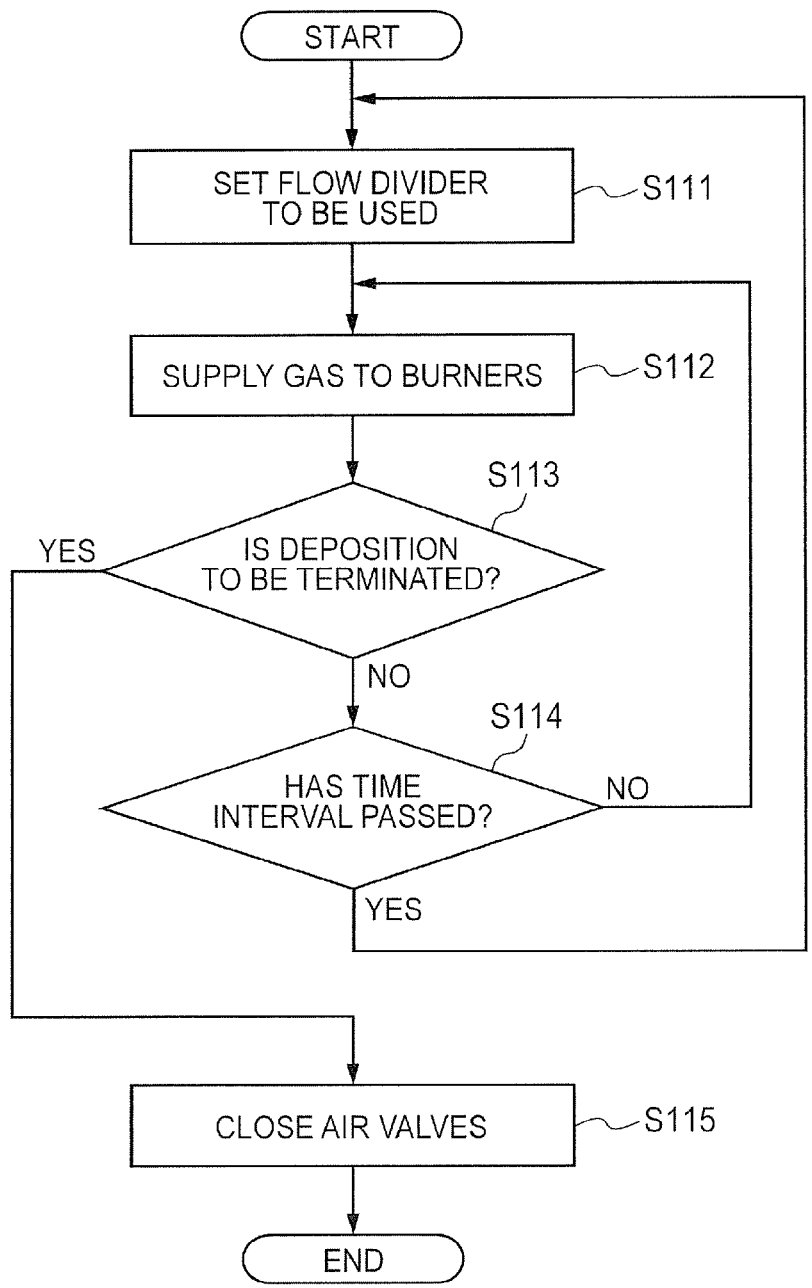
FIG. 4 is a flowchart showing operations of the gas branching apparatus according to the third embodiment of the present invention.

With reference to FIGS. 3 and 4, description is given of a gas branching apparatus according to a third embodiment of the present invention. FIG. 3 is a schematic diagram showing the gas branching apparatus according to this embodiment. FIG. 4 is a flowchart showing operations of the gas branching apparatus according to this embodiment.

First, with reference to FIG. 3, description is given of a configuration of the gas branching apparatus according to this embodiment.

As shown in FIG. 3, a gas branching apparatus 1100 according to this embodiment branches and supplies a gas into a plurality of burners 110-1 to 110-3, which are supply targets to be supplied with the gas. Note that the following description is given of, as an example, the case where the burners 110-1 to 110-3 are burners for manufacturing a fine glass particle deposited body for optical fiber by use of the OVD method. Also, while the number of the burners is not particularly limited as long as two or more burners are provided, the following description is given of, as an example, the case where three burners 110-1 to 110-3 are used.

The burners 110-1 to 110-3 are made of quartz glass, for example, which are manufactured with the same design. Each of the burners 110-1 to 110-3 is supplied with a plurality of gases to form a flame and introduce a raw gas into the flame. The plurality of gases to be supplied to each of the burners 110-1 to 110-3 are, for example, hydrogen ($H_2$) gas, oxygen ($O_2$) gas, argon (Ar) gas, and raw gas. The raw gas includes $SiCl_4$ and the like. In the OVD method, for each of the burners 110-1 to 110-3, such gases are used to form an oxyhydrogen flame and the raw gas is introduced into the oxyhydrogen flame. Although flow rates of the respective gases to the burners 110-1 to 110-3 are not particularly limited, a flow rate of the $H_2$ gas is, for example, 20000 to 40000 sccm. A flow rate of the $O_2$ gas is, for example, 35000 to 40000 sccm. A flow rate of the Ar gas is, for example, 3000 to 5000 sccm. A flow rate of the raw gas is, for example, 3000 to 10000 sccm.

Note that the following description is given of, as an example, a configuration where one of the plurality of gases is supplied to each of the burners 110-1 to 110-3. However, a configuration where another gas is supplied to each of the burners 110-1 to 110-3 may also be the same as the configuration described below.

A long rod-shaped core material 112, onto which flames are blown from the burners 110-1 to 110-3, is a material on which fine glass particles are deposited to be a preform, and is a glass rod, for example. The core material 112 is held such that its longitudinal direction is vertical. Also, the core material 112 is held so as to be rotatable with its central axis as a rotation axis. The length of the core material 112 is, for example, but not particularly limited to, several meters, more specifically, 1 to 2 m, for example.

When the core material 112 is increased in size and thus increased in length or weight, deflection occurs in the core material 112 if the core material 112 is held such that the longitudinal direction thereof is horizontal. This makes it difficult to manufacture a fine glass particle deposited body while ensuring uniformity in the longitudinal direction. In this embodiment, since the core material 112 is held such that the longitudinal direction thereof is vertical, occurrence of deflection in the core material 112 can be suppressed.

The burners 110-1 to 110-3 are arranged in the vertical direction at equal intervals along the longitudinal direction of the long rod-shaped core material 112. Note that while the description is given of, as an example, the case where the three burners 110-1 to 110-3 are provided in this embodiment, the number of burners to be arranged for the core material 112 having a length of 1 to 2 m, for example, can be set to 5 to 30. Thus, since the burners 110-1 to 110-3 are arranged at equal intervals, a plurality of flames from the burners 110-1 to 110-3 are blown toward the core material 112 at equal intervals.

Moreover, the burners 110-1 to 110-3 are configured to be movable back and forth within a predetermined range along the longitudinal direction of the core material 112. Note that the core material 112 may be configured to be movable back and forth along its longitudinal direction, instead of the burners 110-1 to 110-3 being configured to be movable back and forth.

The gas branching apparatus 1100 according to this embodiment includes a plurality of flow dividers 114-1 to 114-3 configured to branch a gas to be supplied to the plurality of burners 110-1 to 110-3. Also, the gas branching apparatus 1100 according to this embodiment includes a piping system for supplying a gas to the flow dividers 114-1 to 114-3 and a piping system for connecting between the plurality of flow dividers 114-1 to 114-3 and the plurality of burners 110-1 to 110-3.

The flow dividers 114-1 to 114-3 are made of metal, for example, and manufactured with the same design.

The flow divider 114-1 includes two gas inlets 114-1*i*-1 and 114-1*i*-2 and a plurality of gas outlets 114-1*o*-1 to 114-1*o*-3, which are the same in number as the plurality of burners 110-1 to 110-3. The plurality of gas outlets 114-1*o*-1 to 114-1*o*-3 are provided at equal intervals in a certain array direction.

The flow divider 114-2 includes two gas inlets 114-2*i*-1 and 114-2*i*-2 and a plurality of gas outlets 114-2*o*-1 to 114-2*o*-3, which are the same in number as the plurality of burners 110-1 to 110-3. The plurality of gas outlets 114-2*o*-1 to 114-2*o*-3 are provided at equal intervals in a certain array direction.

The flow divider 114-3 includes two gas inlets 114-3*i*-1 and 114-3*i*-2 and a plurality of gas outlets 114-3*o*-1 to 114-3*o*-3, which are the same in number as the plurality of burners 110-1 to 110-3. The plurality of gas outlets 114-3*o*-1 to 114-3*o*-3 are provided at equal intervals in a certain array direction.

The flow dividers 114-1 to 114-3 are vertically arranged in this order from the upper side to the lower side. In the flow dividers 114-1 to 114-3 vertically arranged, the array direction of the plurality of gas outlets 114-1*o*-1 to 114-1*o*-3, 114-2*o*-1 to 114-2*o*-3, and 114-3*o*-1 to 114-3*o*-3 is vertical as in the case of the longitudinal direction of the core material 112.

Since the flow dividers 114-1 to 114-3 are arranged as described above, the plurality of gas outlets of each of the flow dividers 114-1 to 114-3 are located at different vertical positions, and thus have a difference in vertical level thereamong. More specifically, in the flow divider 114-1, the gas outlet 114-1*o*-1 is located in the upper level, the gas outlet 114-1*o*-2 is located in the middle level, and the gas outlet 114-1*o*-3 is located in the lower level. In the flow divider 114-2, the gas outlet 114-2*o*-1 is located in the upper level, the gas outlet 114-2*o*-2 is located in the middle level, and the gas outlet 114-2*o*-3 is located in the lower level. In the flow divider 114-3, the gas outlet 114-3*o*-1 is located in the upper level, the gas outlet 114-3*o*-2 is located in the middle level, and the gas outlet 114-3*o*-3 is located in the lower level.

Note that the volume of the flow dividers 114-1 to 114-3 is, for example, but not particularly limited to, 1000 to 5000 cm$^3$, which can be selected according to gas supply conditions and the like. Moreover, while the description is given of the case where the flow dividers 114-1 to 114-3 each include two gas inlets, the number of the gas inlets is not limited to 2. The number of the gas inlets may be one or two or more, and can be changed as needed according to the volume of the flow dividers 114-1 to 114-3, and the like.

The gas branching apparatus 1100 according to this embodiment includes pipes 116-1 and 116-2 for supplying the flow dividers 114-1 to 114-3 with the same kind of gas as that to be supplied to the burners 110-1 to 110-3. The pipes 116-1 and 116-2 have their upstream ends connected to a supply source (not shown) of the gas to be supplied to the burners 110-1 to 110-3. The pipes 116-1 and 116-2 are provided with MFCs 118-1 and 118-2, respectively. The MFCs 118-1 and 118-2 enable control of flow rates of gases flowing toward the flow dividers 114-1 to 114-3 through the pipes 116-1 and 116-2.

The pipes 116-1 and 116-2 are each branched, at their downstream end side, into a plurality of branch pipes, which are the same in number as the flow dividers 114-1 to 114-3. More specifically, the pipe 116-1 is branched into branch pipes 116-1-1 to 116-1-3 at its downstream end side. The pipe 116-2 is branched into branch pipes 116-2-1 to 116-2-3 at its downstream end side.

The branch pipes 116-1-1 and 116-2-1 have their downstream ends connected to two gas inlets 114-1*i*-1 and 114-1*i*-2 of the flow divider 114-1, respectively. The branch pipes 116-1-2 and 116-2-2 have their downstream ends connected to two gas inlets 114-2*i*-1 and 114-2*i*-2 of the flow divider 114-2, respectively. The branch pipes 116-1-3 and 116-2-3 have their downstream ends connected to two gas inlets 114-3*i*-1 and 114-3*i*-2 of the flow divider 114-1, respectively.

The branch pipes of the pipes 116-1 and 116-2 are provided with air valves for opening and closing the branch pipes, respectively. More specifically, the branch pipes 116-1-1 and 116-2-1 are provided with air valves BV11 and BV12, respectively. The branch pipes 116-1-2 and 116-2-2 are provided with air valves BV21 and BV22, respectively. The branch pipes 116-1-3 and 116-2-3 are provided with air valves BV31 and BV32, respectively. Note that, in the following description, these air valves may be described as the air valves BVxy (where x is an integer that satisfies 1≤x≤3 and y is 1 or 2).

Moreover, the pipes 120-1-1 to 120-1-3 have their upstream ends connected to the plurality of gas outlets 114-1*o*-1 to 114-1*o*-3 of the flow divider 114-1, respectively. The flow divider 114-1 is designed so as to have an equal branching ratio of the gas to the plurality of gas outlets 114-1*o*-1 to 114-1*o*-3. More specifically, the flow divider 114-1 is designed such that the gas introduced into the flow divider 114-1 through the pipes 116-1-1 and 116-2-1 is delivered into the pipes 120-1-1 to 120-1-3 with an equal branching ratio through the plurality of gas outlets 114-1*o*-1 to 114-1*o*-3.

The pipes 120-1-1 to 120-1-3 are provided with check valves CV11, CV12, and CV13, respectively. The check valves CV11, CV12, and CV13 prevent the gas in the pipes 120-1-1 to 120-1-3 from flowing back from the downstream side toward the flow divider 114-1 that is the upstream side. Note that, instead of the check valves CV11, CV12, and CV13, air valves may be provided, which are opened and closed in synchronization with the air valves BV11 and BV12 on the gas inlet side.

Moreover, the pipes 120-2-1 to 120-2-3 have their upstream ends connected to the plurality of gas outlets 114-2*o*-1 to 114-2*o*-3 of the flow divider 114-1, respectively. The flow divider 114-2 is designed so as to have an equal branching ratio of the gas to the plurality of gas outlets 114-2*o*-1 to 114-2*o*-3. More specifically, the flow divider 114-2 is designed such that the gas introduced into the flow divider 114-2 through the pipes 116-1-2 and 116-2-2 is delivered into the pipes 120-2-1 to 120-2-3 with an equal branching ratio through the plurality of gas outlets 114-2*o*-1 to 114-2*o*-3.

The pipes 120-2-1 to 120-2-3 are provided with check valves CV21, CV22, and CV23, respectively. The check valves CV21, CV22, and CV23 prevent the gas in the pipes 120-2-1 to 120-2-3 from flowing back from the downstream side toward the flow divider 114-2 that is the upstream side. Note that, instead of the check valves CV21, CV22, and CV23, air valves may be provided, which are opened and closed in synchronization with the air valves BV21 and BV22 on the gas inlet side.

Moreover, the pipes 120-3-1 to 120-3-3 have their upstream ends connected to the plurality of gas outlets 114-3*o*-1 to 114-3*o*-3 of the flow divider 114-3, respectively. The flow divider 114-3 is designed so as to have an equal branching ratio of the gas to the plurality of gas outlets 114-3*o*-1 to 114-3*o*-3. More specifically, the flow divider 114-3 is designed such that the gas introduced into the flow divider 114-3 through the pipes 116-1-3 and 116-2-3 is delivered into the pipes 120-3-1 to 120-3-3 with an equal branching ratio through the plurality of gas outlets 114-3*o*-1 to 114-3*o*-3.

The pipes 120-3-1 to 120-3-3 are provided with check valves CV31, CV32, and CV33, respectively. The check valves CV31, CV32, and CV33 prevent the gas in the pipes 120-3-1 to 120-3-3 from flowing back from the downstream side toward the flow divider 114-3 that is the upstream side. Note that, instead of the check valves CV31, CV32, and CV33, air valves may be provided, which are opened and closed in synchronization with the air valves BV31 and BV32 on the gas inlet side.

Note that, in the following description, the above check valves may be described as the check valves CVmn (where m is an integer that satisfies 1≤m≤3 and n is an integer that satisfies 1≤n≤3).

The pipes 120-1-1, 120-2-2, and 120-3-3 have their downstream ends connected in common to an upstream end of a pipe 122-1. These pipes 120-1-1, 120-2-2, and 120-3-3 are connected to the gas outlets different in vertical level in the flow dividers. More specifically, the pipe 120-1-1 is connected to the gas outlet 114-1*o*-1 in the upper level, the pipe 120-2-2 is connected to the gas outlet 114-2*o*-2 in the middle level, and the pipe 120-3-3 is connected to the gas outlet 114-3*o*-3 in the lower level.

The pipes 120-1-3, 120-2-1, and 120-3-2 have their downstream ends connected in common to an upstream end of a pipe 122-2. These pipes 120-1-3, 120-2-1, and 120-3-2 are connected to the gas outlets different in vertical level in the flow dividers. More specifically, the pipe 120-1-3 is connected to the gas outlet 114-1*o*-3 in the lower level, the pipe 120-2-1 is connected to the gas outlet 114-2*o*-1 in the upper level, and the pipe 120-3-2 is connected to the gas outlet 114-3*o*-2 in the middle level.

The pipes 120-1-2, 120-2-3, and 120-3-1 have their downstream ends connected in common to an upstream end of a pipe 122-3. These pipes 120-1-2, 120-2-3, and 120-3-1 are connected to the gas outlets different in vertical level in the flow dividers. More specifically, the pipe 120-1-2 is connected to the gas outlet 114-1*o*-2 in the middle level, the pipe 120-2-3 is connected to the gas outlet 114-2*o*-3 in the lower level, and the pipe 120-3-1 is connected to the gas outlet 114-3*o*-1 in the upper level.

The pipe 122-1 has its downstream end connected to the burner 110-1, so that the burner 110-1 is supplied with a gas through the pipe 122-1. The pipe 122-2 has its downstream end connected to the burner 110-2, so that the burner 110-2 is supplied with a gas through the pipe 122-2. The pipe 122-3 has its downstream end connected to the burner 110-3, so that the burner 110-3 is supplied with a gas through the pipe 122-3.

Thus, the plurality of gas outlets of the plurality of flow dividers 114-1 to 114-3 are connected in 1:1 through the pipes to any of the plurality of burners 110-1 to 110-3. More specifically, the gas outlet 114-1*o*-1 of the flow divider 114-1 is connected to the burner 110-1 through the pipes 120-1-1 and 122-1. The gas outlet 114-1*o*-2 of the flow divider 114-1 is connected to the burner 110-3 through the pipes 120-1-2 and 122-3. The gas outlet 114-1*o*-3 of the flow divider 114-1 is connected to the burner 110-2 through the pipes 120-1-3 and 122-2. The gas outlet 114-2*o*-1 of the flow divider 114-2 is connected to the burner 110-2 through the pipes 120-2-1 and 122-2. The gas outlet 114-2*o*-2 of the flow divider 114-2 is connected to the burner 110-1 through the pipes 120-2-2 and 122-1. The gas outlet 114-2*o*-3 of the flow divider 114-2 is connected to the burner 110-3 through the pipes 120-2-3 and 122-3. The gas outlet 114-3*o*-1 of the flow divider 114-3 is connected to the burner 110-3 through the pipes 120-3-1 and 122-3. The gas outlet 114-3*o*-2 of the flow divider 114-3 is connected to the burner 110-2 through the pipes 120-3-2 and 122-2. The gas outlet 114-3*o*-3 of the flow divider 114-3 is connected to the burner 110-1 through the pipes 120-3-3 and 122-1.

The gas branching apparatus 1100 according to this embodiment further includes a controller 124 configured to control opening and closing of the air valves BVxy. The controller 124 includes a CPU (not shown) configured to execute various kinds of processing such as calculation, control, and determination. The controller 124 also includes a ROM (not shown) configured to store various control programs to be executed by the CPU, a database to be referred to by the CPU, and the like. The controller 124 further includes a RAM (not shown) configured to temporarily store data that is being processed by the CPU, input data, and the like.

The controller 124 controls opening and closing of the air valves BVxy so as to randomly switch two or more times the flow divider to be used to branch the gas to any of the flow dividers 114-1 to 114-3 during manufacturing of the fine glass particle deposited body using the flames from the burners 110-1 to 110-3. As to switching of the flow divider to be used, the controller 124 controls opening and closing of the air valves BV11 and BV12 in synchronization with the flow divider 114-1. The controller 124 controls opening and closing of the air valves BV21 and BV22 in synchronization with the flow divider 114-2. The controller 124 controls opening and closing of the air valves BV31 and BV32 in synchronization with the flow divider 114-3. Moreover, the controller 124 sets any one of the pairs of the air valves to be controlled in synchronization, including the pair of the air valves BV11 and BV12, the pair of the air valves BV21 and BV22, and the pair of the air valves BV31 and BV32, to the opened state, and the rest of the pairs to the closed state.

The controller 124 executes such switching of the flow divider to be used at predetermined time intervals. This time interval can be, but not particularly limited to, 1 to 10 minutes, for example.

During manufacturing of the fine glass particle deposited body, the switching of the flow divider by the controller 124 described above allows any one of the flow dividers 114-1 to 114-3 to be used to branch the gas to be supplied to the plurality of burners 110-1 to 110-3, thereby randomly switching the flow divider to be used.

When the flow divider to be used is changed, the vertical positions of the gas outlets of the flow divider for supplying the gas to the plurality of burners 110-1 to 110-3 are changed. More specifically, when the flow divider 114-1 is used, the gas is supplied to the burner 110-1 through the upper gas outlet 114-1*o*-1, to the burner 110-2 through the lower gas outlet 114-1*o*-3, and to the burner 110-3 through the middle gas outlet 114-1*o*-2. When the flow divider 114-2 is used, the gas is supplied to the burner 110-1 through the middle gas outlet 114-2*o*-2, to the burner 110-2 through the upper gas outlet 114-2*o*-1, and to the burner 110-3 through the lower gas outlet 114-2*o*-3. When the flow divider 114-3 is used, the gas is supplied to the burner 110-1 through the lower gas outlet 114-3*o*-3, to the burner 110-2 through the middle gas outlet 114-3*o*-2, and to the burner 110-3 through the upper gas outlet 114-3*o*-1.

As for manufacturing of a fine glass particle deposited body, when the gas is branched by a flow divider and supplied to a plurality of burners, an increase in size of the fine glass particle deposited body to be manufactured also increases the size of the flow divider itself, resulting in the need to increase the number of branches by the flow divider. Moreover, when a core material is held such that its longitudinal direction is horizontal, increases in weight of the core material and the fine glass particle deposited body cause deflection therein. In order to suppress such deflection, it is required to hold the core material such that the longitudinal direction thereof is vertical. Moreover, in this case, in order to minimize pipe distance differences between the plurality of gas outlets of the flow divider and the plurality of burners and pipe resistance differences associated therewith, it is also required to vertically arrange the flow divider such that the array direction of the plurality of gas outlets is vertical.

However, when the flow divider is vertically arranged as described above, the influence of gravity causes a pressure difference between vertical positions in the flow divider, which may result in a difference in branching ratio among the plurality of gas outlets. Particularly, a gas having a relatively large specific gravity, such as the raw gas, is likely to be influenced by the gravity, and is thus likely to cause a difference in branching ratio. Such a difference in branching ratio of the flow divider makes it difficult to supply the gas to the plurality of burners with high uniformity. As a result, uniformity and stability of the fine glass particle deposited body in its longitudinal direction, which is manufactured along the longitudinal direction of the core material, may be impaired.

To counter this, in the gas branching apparatus 1100 according to this embodiment, the controller 124 randomly switches the flow divider to be used to branch the gas among the flow dividers 114-1 to 114-3. When the flow divider to be used is changed, the vertical positions of the gas outlets of the flow divider for supplying the gas to the plurality of burners 110-1 to 110-3 are changed as described above. Thus, such influences of the gravity on branching of the gas by the flow divider as described above due to the processing accuracy or aging changes as described above are canceled out. Accordingly, the influences of the gravity can be reduced.

In the gas branching apparatus 1100 according to this embodiment, the plurality of flow dividers 114-1 to 114-3 are designed so as to have an equal branching ratio of the gas to the plurality of gas outlets. Also, the pipes are designed so as to minimize a difference in pipe resistance from the plurality of gas outlets to the burners 110-1 to 110-3. However, processing accuracy or aging changes may cause the branching ratio of the flow dividers 114-1 to 114-3 to be not completely even. Moreover, processing accuracy or aging changes may cause a difference in pipe resistance from the plurality of gas outlets to the burners 110-1 to 110-3. Furthermore, even though the burners 110-1 to 110-3 are manufactured with the same design, there is individual difference among the burners 110-1 to 110-3 due to the processing accuracy or aging changes. Thus, there are variations in members or parts due to the processing accuracy or aging changes, between the flow dividers 114-1 to 114-3 and the burners 110-1 to 110-3. Such variations in members or parts make it difficult to supply the gas to the plurality of burners 110-1 to 110-3 with high uniformity. As a result, uniformity and stability of the fine glass particle deposited body in its longitudinal direction, which is manufactured along the longitudinal direction of the core material 112, may be impaired.

To counter this, in the gas branching apparatus 1100 according to this embodiment, the controller 124 randomly switches the flow divider to be used to branch the gas as described above. Thus, such influences of the variations in members or parts due to the processing accuracy or aging changes as described above are canceled out. Accordingly, the influences of the variations in members or parts can be reduced.

Therefore, according to this embodiment, the gas can be supplied to the plurality of burners 110-1 to 110-3 with high uniformity while reducing the influences of the gravity and the influences of the variations in members or parts. This way, according to this embodiment, a fine glass particle deposited body excellent in uniformity and stability in the longitudinal direction can be manufactured. Moreover, even in the event of replacement of burners or pipes, the same gas supply state as that before the replacement can be reproduced with high reproducibility. Thus, a fine glass particle deposited body excellent in uniformity and stability in the longitudinal direction can be manufactured with high reproducibility.

Next, with reference to FIG. 4, description is further given of operations of the gas branching apparatus 1100 according to this embodiment.

Before the gas branching apparatus 1100 starts its operation, the air valves BVxy are all set in the closed state.

First, the gas branching apparatus 1100 starts its operation, thereby introducing a gas into the flow dividers 114-1 to 114-3 through the pipes 116-1 and 116-2. During the introduction of the gas through the pipes 116-1 and 116-2, the MFCs 118-1 and 118-2 control the flow rates of the gases flowing through the pipes 116-1 and 116-2, respectively.

Next, the controller 124 controls opening and closing of the air valves BVxy. Thus, any one of the pairs of the air valves BV11 and BV12, BV21 and BV22, and BV31 and BV32 is set to the opened state, and the rest of the pairs are set to the closed state. As for the control of opening and closing of the air valves BVxy, the controller 124 generates a random number or pseudo random number, for example, to select the pair of air valves to be set to the opened state based on the generated random number or pseudo random number. Then, the controller 124 sets the selected pair of air valves in the opened state and the rest in the closed state. Thus, any one of the flow dividers 114-1 to 114-3 is set as the flow divider to be used to branch the gas (Step S111).

After setting the flow divider to be used to branch the gas as described above, the gas is branched by the set flow divider and supplied to the plurality of burners 110-1 to 110-3, respectively (Step S112). Note that the flow dividers 114-1 to 114-3 are provided with check valves CVmn on the gas outlet side. Thus, no gas flows back into the flow divider that is not used to branch the gas. Also, other gases used to manufacture a fine glass particle deposited body are similarly supplied to the plurality of burners 110-1 to 110-3.

In the respective burners 110-1 to 110-3 supplied with the gases as described above, flames are formed using a fuel gas among the gases supplied, and a raw gas among the gases supplied is introduced into the flames. Thus, the flames containing the raw material are blown onto the core material 112 rotated with its central axis as a rotation axis. Accordingly, fine glass particles to be a preform of optical fiber are sequentially deposited on the core material 112. Note that, in the meantime, the plurality of burners 110-1 to 110-3 may be moved back and forth along the longitudinal direction of the core material 112.

During the deposition of the fine glass particles on the core material 112 as described above, the deposition weight of the fine glass particles deposited on the core material 112 is monitored, and it is determined based on the monitored deposition weight whether or not to terminate the deposition of the fine glass particles (Step S113).

When the deposition weight of the fine glass particles is less than a predetermined weight and the deposition is continued rather than being terminated (Step S113, NO), it is determined whether or not a time interval for switching the flow divider to be used to branch the gas has passed (Step S114).

When the time interval for switching the flow divider to be used to branch the gas has not passed (Step S114, NO), the processing returns to Step S112 to continue the deposition of the fine glass particles while supplying the respective gases.

On the other hand, when the time interval for switching the flow divider to be used to branch the gas has passed (Step S114, YES), the processing returns to Step S111 to again control opening and closing of the air valves BVxy by the controller 124. Thus, any one of the pairs of the air valves BV11 and BV12, BV21 and BV22, and BV31 and BV32 is set to the opened state, and the rest of the pairs are set to the closed state. As for the control of opening and closing of the air valves BVxy, the controller 124 generates a random number or pseudo random number, for example, to select the pair of air valves to be set to the opened state based on the generated random number or pseudo random number. Then, the controller 124 sets the selected pair of air valves in the opened state and the rest in the closed state. Thus, the deposition of the fine glass particles is continued while supplying the gases after randomly switching the flow divider to be used to branch the gas by setting the flow divider to be used to branch the gas again.

As described above, according to this embodiment, the random switching of the flow divider by the controller 124 randomly switches the vertical positions of the gas outlets of the flow divider connected to the burners 110-1 to 110-3. Thus, influences of gravity on the branching ration of the flow divider can be reduced. Moreover, influences of variations in members or parts due to processing accuracy or aging changes can also be reduced.

Note that it is preferable that the switching of the flow divider to be used to branch the gas is performed such that a cumulative time of times when the flow dividers 114-1 to 114-3 are used to branch the gas is equal thereamong. Thus, the influences of the gravity and the influences of the variations in members or parts due to processing accuracy or aging changes can be further reduced. As a result, the gases can be supplied to the plurality of burners 110-1 to 110-3 with higher uniformity.

On the other hand, when the deposition weight of the fine glass particles is the predetermined weight and thus the deposition is to be terminated (Step S113, YES), the controller 124 sets all the air valves BVxy in the closed state (Step S115). Thus, the deposition of the fine glass particles on the core material 112 is terminated to obtain a fine glass particle deposited body that is a deposition of the fine glass particles.

Thereafter, the glass particle deposited body thus obtained is dehydrated and sintered in a furnace to obtain a preform.

As described above, according to this embodiment, gases can be supplied to a plurality of supply targets with high uniformity and high reproducibility.

[Fourth Embodiment]

A gas branching apparatus according to a fourth embodiment of the present invention is described. Note that the same constituent components as those in the gas branching apparatus according to the third embodiment described above are denoted by the same reference numerals, and description thereof is omitted or simplified.

In the third embodiment described above, the description is given of, as an example, the case where the opening and closing of the air valves BVxy are controlled so as to randomly switch two or more times the flow divider to be used to branch the gas. However, the control of the opening and closing of the air valves BVxy is not limited to the case where the control is performed so as to randomly switch two or more times the flow divider to be used to branch the gas. For example, the opening and closing of the air valves BVxy may be controlled so as to regularly switch two or more times the flow divider to be used to branch the gas.

In this embodiment, description is given of the case where opening and closing of the air valves BVxy are controlled so as to regularly switch two or more times the flow divider to be used to branch the gas.

In this case, for example, every time a predetermined time interval for switching the flow divider to be used to branch the gas passes, the pair of the air valves BV11 and BV12, the pair of the air valves BV21 and BV22, and the pair of the air valves BV31 and BV32 are repeatedly set to the opened state in this order. Meanwhile, the rest of the pairs other than those set to the opened state are set to the closed state. Thus, the flow divider to be used to branch the gas is sequentially and repeatedly switched in the order of the flow divider 114-1, the flow divider 114-2, and the flow divider 114-3.

As described above, opening and closing of the air valves BVxy can also be controlled so as to regularly switch two or more times the flow divider to be used to branch the gas. Such regular switching can also reduce the influences of gravity and the influences of the variations in members or parts. Therefore, according to this embodiment, the gases can be supplied to the plurality of burners 110-1 to 110-3 with high uniformity while reducing the influences of gravity and the influences of the variations in members or parts.

Note that, in this case, again, it is preferable that the switching of the flow divider to be used to branch the gas is performed such that a cumulative time of times when the flow dividers 114-1 to 114-3 are used to branch the gas is equal thereamong.

[Fifth Embodiment]

A gas branching apparatus according to a fifth embodiment of the present invention is described. Note that the same constituent components as those in the gas branching apparatus according to the third and fourth embodiments described above are denoted by the same reference numerals, and description thereof is omitted or simplified.

In the third and fourth embodiments, the description is given of, as an example, the case where the plurality of flow dividers 114-1 to 114-3 are vertically arranged. In this case, the array direction of the plurality of gas outlets 114-1o-1 to 114-1o-3, 114-2o-1 to 114-2o-3, and 114-3o-1 to 114-3o-3 is vertical as in the case of the longitudinal direction of the core material 112. However, the mode of arranging the plurality of flow dividers 114-1 to 114-3 is not limited to the vertical arrangement. For example, the plurality of flow dividers 114-1 to 114-3 may be horizontally arranged.

In this embodiment, description is given of the case where the plurality of flow dividers 114-1 to 114-3 are horizontally arranged.

In this case, the array direction of the plurality of gas outlets 114-1o-1 to 114-1o-3, 114-2o-1 to 114-2o-3, and 114-3o-1 to 114-3o-3 is horizontal in the horizontally arranged flow dividers 114-1 to 114-3.

Note that the core material 112 is held such that its longitudinal direction is vertical as in the case of the third and fourth embodiments.

As described above, in this embodiment where the plurality of flow dividers 114-1 to 114-3 are horizontally arranged, again, the controller 124 randomly switches the flow divider to be used to branch the gas, as in the case of the third and fourth embodiments. Thus, the influences of the variations in members or parts due to the processing accuracy or aging changes as described above can be reduced. Therefore, according to this embodiment, the gas can be supplied to the plurality of burners 110-1 to 110-3 with high uniformity while reducing the influences of the variations in members or parts.

The present invention is not limited to the third to fifth embodiments described above, but various modifications can be made thereto.

For example, in the third to fifth embodiments, the description is given of, as an example, the case where the gas is branched and supplied into the three burners 110-1 to 110-3. However, the number of the burners is not particularly limited as long as two or more burners are provided. Moreover, the description is given of, as an example, the case where the gas branching apparatus 1100 includes the three flow dividers 114-1 to 114-3. However, the number of the flow dividers is not particularly limited as long as two or more flow dividers are provided. It is preferable, however, that the number of the flow dividers is 10 or less to prevent the apparatus from becoming complex.

When a gas is branched and supplied into first to N-th (where N is an integer of 2 or more) burners, a plurality of flow dividers having the same design are used. The flow dividers each include first to N-th gas outlets through which the gas is branched and discharged, and are designed so as to have an equal branching ratio of the gas to the first to N-th gas outlets. The first to N-th gas outlets of each of the plurality of flow dividers are located at the different positions such as vertical positions each other in the flow divider. Via each of pipes, one of the first to N-th gas outlets of each of the plurality of flow dividers is connected to any of the first to N-th burners on a one-to-one basis. The plurality of gas outlets connected to the first to N-th burners, respectively, are located at the different positions such as vertical positions each other in the flow divider.

When the gas is branched and supplied to the first to N-th burners, the controller may switch the flow divider to be used to branch the gas so as to use any one of the plurality of flow dividers for branching of the gas.

Moreover, in the third to fifth embodiments, the description is given of, as an example, the case where the burners 110-1 to 110-3 are used as a plurality of supply targets to be supplied with the gas. However, the supply targets are not limited to the burners. The supply targets may be those subjected to some kind of processing, such as manufacturing of products and processing on processed products, using the supplied gas.

Moreover, in the third to fifth embodiments, the description is given of, as an example, the case where the burners 110-1 to 110-3 as the supply targets are arranged along the longitudinal direction of the core material 112 that is an object. However, the plurality of supply targets do not always have to be those arranged along the longitudinal direction of the object.

Moreover, in the third to fifth embodiments, the description is given of, as an example, the case using the air valves BVxy. However, instead of the air valves, various valves can be used, whose opening and closing can be controlled by the controller 124. For example, electromagnetic valves or the like can be used instead of the air valves.

Moreover, in the third to fifth embodiments, the description is given of, as an example, the case where the flow divider to be used to branch the gas is switched by controlling the opening and closing of the air valves. A method for switching the flow divider is not limited thereto. Various other methods can be used to switch the flow divider to be used to branch the gas.

Moreover, in the third to fifth embodiments, the description is given of, as an example, the case where the core material 112 is held such that the longitudinal direction thereof is vertical. However, the mode of holding the core material 112 is not limited thereto. For example, the core material 112 may be held such that the longitudinal direction thereof is horizontal. In this case, the burners 110-1 to 110-3 can be arranged at equal intervals along the longitudinal direction of the core material 112 that is horizontally disposed. Moreover, the flow dividers 114-1 to 114-3 can be vertically or horizontally arranged as described above.

Moreover, in the third to fifth embodiments, the description is given of, as an example, the case where the number of the plurality of burners 110-1 to 110-3 is the same as the number of the plurality of flow dividers 114-1 to 114-3. However, the numbers thereof do not always have to be the same. It is preferable, however, that the number of the plurality of burners is the same as the number of the plurality of flow dividers. Thus, the gas outlets at all the positions in the flow dividers can be connected to the respective burners.

Moreover, the third to fifth embodiments are also applicable to the case where the branching ratio of the flow divider is not even.

[Sixth Embodiment]

Figure 5:
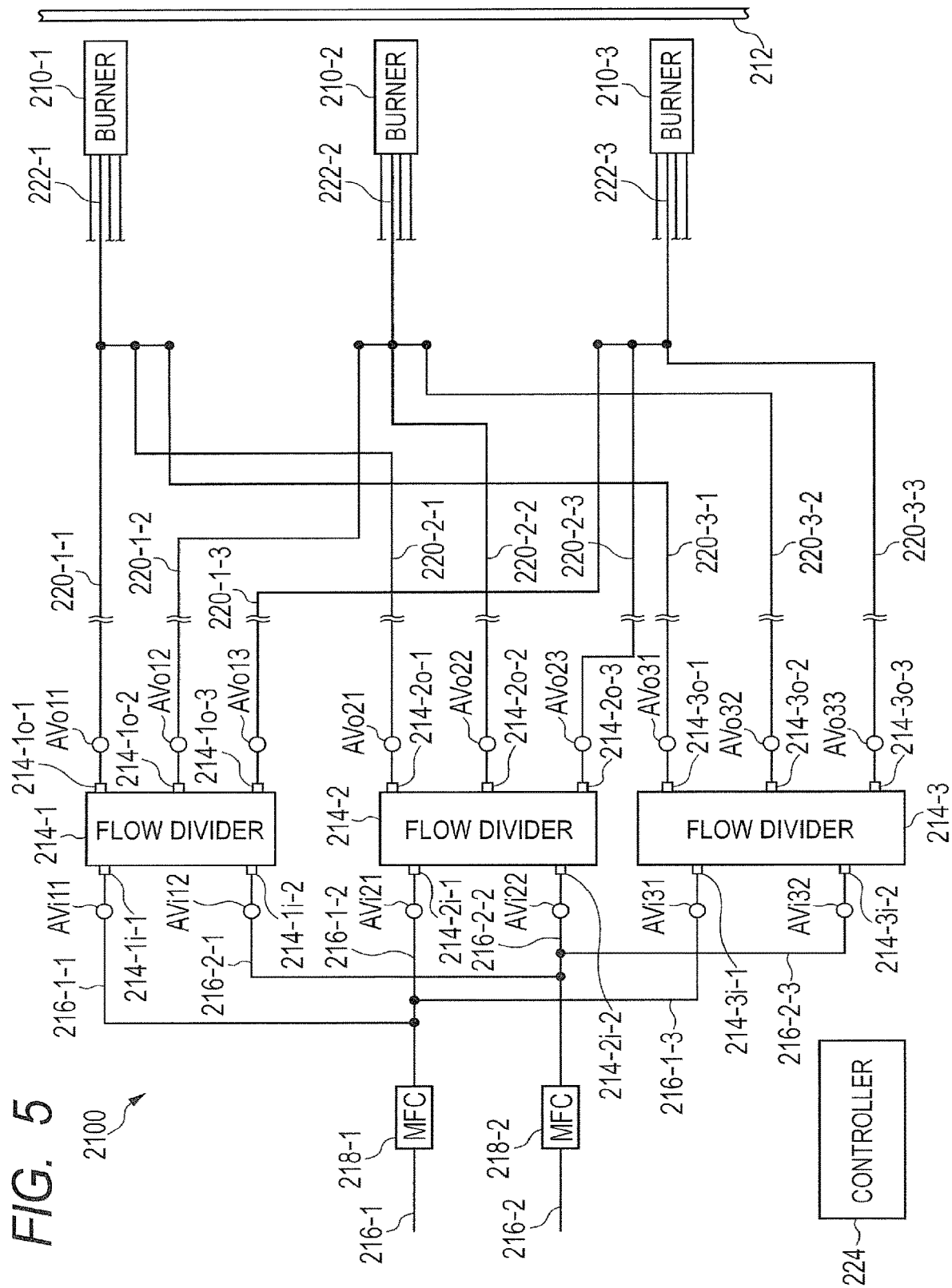
FIG. 5 is a schematic diagram showing a gas branching apparatus according to a sixth embodiment of the present invention.
Figure 6:
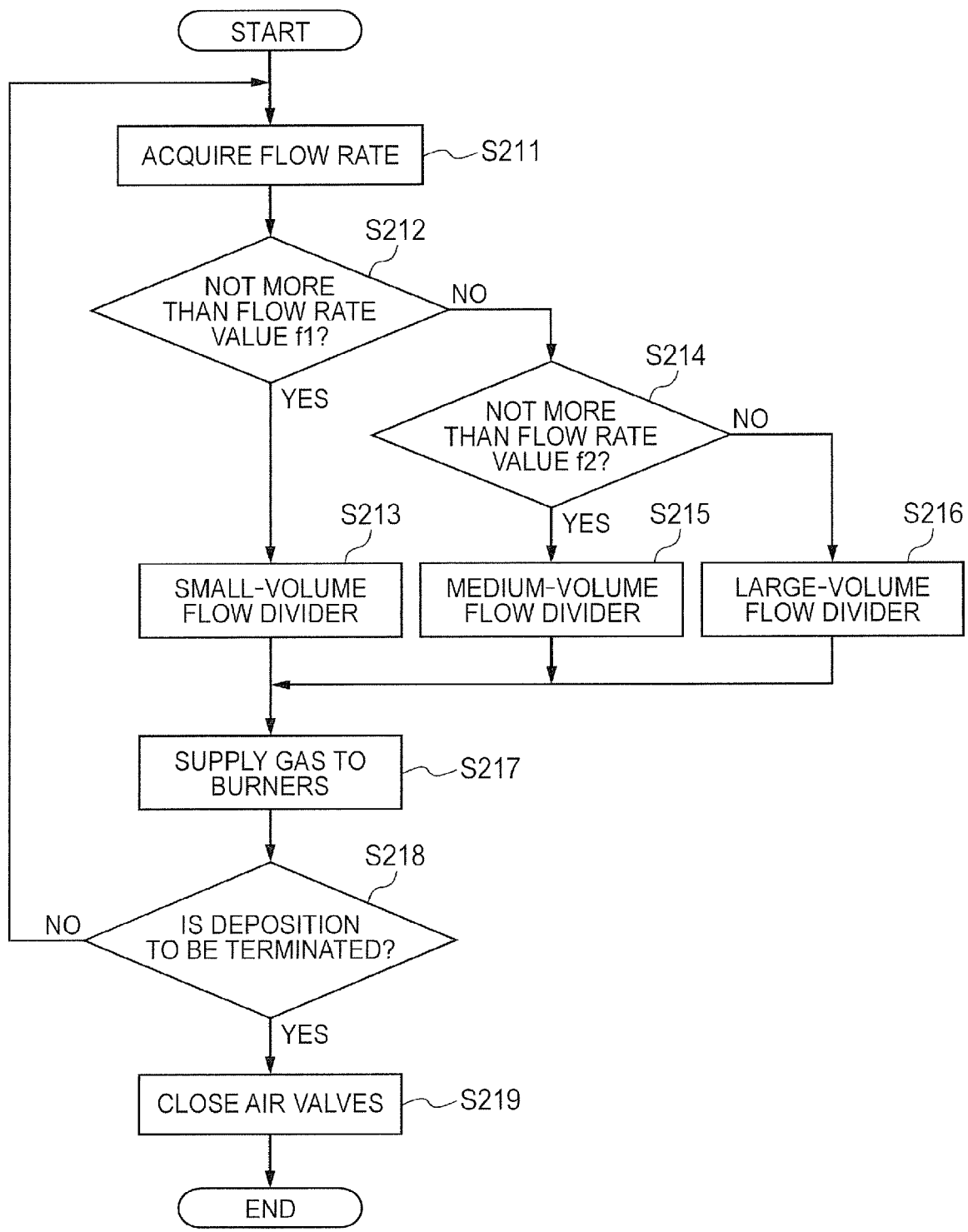
FIG. 6 is a flowchart showing operations of the gas branching apparatus according to the sixth embodiment of the present invention.

With reference to FIGS. 5 and 6, description is given of a gas branching apparatus according to a sixth embodiment of the present invention. FIG. 5 is a schematic diagram showing the gas branching apparatus according to this embodiment. FIG. 6 is a flowchart showing operations of the gas branching apparatus according to this embodiment.

First, with reference to FIG. 5, description is given of a configuration of the gas branching apparatus according to this embodiment.

As shown in FIG. 5, a gas branching apparatus 2100 according to this embodiment branches and supplies a gas into a plurality of burners 210-1 to 210-3, which are supply targets to be supplied with the gas. Note that the following description is given of, as an example, the case where the burners 210-1 to 210-3 are burners for manufacturing a fine glass particle deposited body for optical fiber by use of the OVD method. Also, while the number of the burners is not particularly limited as long as two or more burners are provided, the following description is given of, as an example, the case where three burners 210-1 to 210-3 are used.

The burners 210-1 to 210-3 are made of quartz glass, for example, which are manufactured with the same design. Each of the burners 210-1 to 210-3 is supplied with a plurality of gases to form a flame and introduce a raw gas into the flame. The plurality of gases to be supplied to each of the burners 210-1 to 210-3 are, for example, hydrogen ($H_2$) gas, oxygen ($O_2$) gas, argon (Ar) gas, and raw gas. The raw gas includes $SiCl_4$ and the like. In the OVD method, for each of the burners 210-1 to 210-3, such gases are used to form an oxyhydrogen flame and the raw gas is introduced into the oxyhydrogen flame. Although flow rates of the respective gases to the burners 210-1 to 210-3 are not particularly limited, a flow rate of the $H_2$ gas is, for example, 20000 to 40000 sccm. A flow rate of the $O_2$ gas is, for example, 35000 to 40000 sccm. A flow rate of the Ar gas is, for example, 3000 to 5000 sccm. A flow rate of the raw gas is, for example, 3000 to 10000 sccm.

Note that the following description is given of, as an example, a configuration where one of the plurality of gases is supplied to each of the burners 210-1 to 210-3. However, a configuration where another gas is supplied to each of the burners 210-1 to 210-3 may also be the same as the configuration described below.

A long rod-shaped core material 212, onto which flames are blown from the burners 210-1 to 210-3, is a material on which fine glass particles are deposited to be a preform, and is a glass rod, for example. The core material 212 is held such that its longitudinal direction is horizontal. Also, the core material 212 is held so as to be rotatable with its central axis as a rotation axis. The length of the core material 212 is, for example, but not particularly limited to, several meters, more specifically, 1 to 2 m, for example.

The burners 210-1 to 210-3 are arranged in the horizontal direction at equal intervals along the longitudinal direction of the long rod-shaped core material 212. Note that while the description is given of, as an example, the case where the three burners 210-1 to 210-3 are provided in this embodiment, the number of burners to be arranged for the core material 212 having a length of 1 to 2 m, for example, can be set to 5 to 30. Thus, since the burners 210-1 to 210-3 are arranged at equal intervals, a plurality of flames from the burners 210-1 to 210-3 are blown toward the core material 212 at equal intervals.

Moreover, the burners 210-1 to 210-3 are configured to be movable back and forth within a predetermined range along the longitudinal direction of the core material 212. Note that the core material 212 may be configured to be movable back and forth along its longitudinal direction, instead of the burners 210-1 to 210-3 being configured to be movable back and forth.

The gas branching apparatus 2100 according to this embodiment includes a plurality of flow dividers 214-1 to 214-3 configured to branch a gas to be supplied to the plurality of burners 210-1 to 210-3. Also, the gas branching apparatus 2100 according to this embodiment includes a piping system for supplying a gas to the flow dividers 214-1 to 214-3 and a piping system for connecting between the plurality of flow dividers 214-1 to 214-3 and the plurality of burners 210-1 to 210-3.

The flow dividers 214-1 to 214-3 are made of metal, for example, and have different volumes. More specifically, the flow divider 214-1 has a small volume. The flow divider 214-2 has a medium volume larger than the volume of the flow divider 214-1. The flow divider 214-3 has a large volume larger than the volume of the flow divider 214-2. The flow dividers 214-1 to 214-3 are used according to the flow rate of the gas to be branched, as described later.

The flow divider 214-1 includes two gas inlets 214-1*i*-1 and 214-1*i*-2 and a plurality of gas outlets 214-1*o*-1 to 214-1*o*-3, which are the same in number as the plurality of burners 210-1 to 210-3. The plurality of gas outlets 214-1*o*-1 to 214-1*o*-3 are provided at equal intervals in a certain array direction.

The flow divider 214-2 includes two gas inlets 214-2*i*-1 and 214-2*i*-2 and a plurality of gas outlets 214-2*o*-1 to 214-2*o*-3, which are the same in number as the plurality of burners 210-1 to 210-3. The plurality of gas outlets 214-2*o*-1 to 214-2*o*-3 are provided at equal intervals in a certain array direction.

The flow divider 214-3 includes two gas inlets 214-3*i*-1 and 214-3*i*-2 and a plurality of gas outlets 214-3*o*-1 to 214-3*o*-3, which are the same in number as the plurality of burners 210-1 to 210-3. The plurality of gas outlets 214-3*o*-1 to 214-3*o*-3 are provided at equal intervals in a certain array direction.

The flow dividers 214-1 to 214-3 are horizontally arranged. In the flow dividers 214-1 to 214-3 horizontally arranged, the array direction of the plurality of gas outlets 214-1*o*-1 to 214-1*o*-3, 214-2*o*-1 to 214-2*o*-3, and 214-3*o*-1 to 214-3*o*-3 is horizontal as in the case of the longitudinal direction of the core material 212.

Note that the volumes of the flow dividers 214-1 to 214-3 are not particularly limited but can be selected according to gas supply conditions and the like. The volume of the small-volume flow divider 214-1 is, for example, 500 to 1000 cm$^3$. The volume of the medium-volume flow divider 214-2 is, for example, 1000 to 2000 cm$^3$. The volume of the large-volume flow divider 214-3 is, for example, 2000 to 3000 cm$^3$. Moreover, although description is given of the case where the flow dividers 214-1 to 214-3 each include two gas inlets, the number of the gas inlets is not limited to 2. The number of the gas inlets may be one or two or more, and can be changed as needed according to the gas supply conditions, the volumes of the flow dividers 214-1 to 214-3, and the like.

The gas branching apparatus 2100 according to this embodiment includes pipes 216-1 and 216-2 for supplying the flow dividers 214-1 to 214-3 with the same kind of gas as that to be supplied to the burners 110-1 to 110-3. The pipes 216-1 and 216-2 have their upstream ends connected to a supply source (not shown) of the gas to be supplied to the burners 210-1 to 210-3. The pipes 216-1 and 216-2 are provided with MFCs 218-1 and 218-2, respectively. The MFCs 218-1 and 218-2 enable control of flow rates of gases flowing toward the flow dividers 214-1 to 214-3 through the pipes 216-1 and 216-2.

The pipes 216-1 and 216-2 are each branched, at their downstream end side, into a plurality of branch pipes, which are the same in number as the flow dividers 214-1 to 214-3. More specifically, the pipe 216-1 is branched into branch pipes 216-1-1 to 216-1-3 at its downstream end side. The pipe 216-2 is branched into branch pipes 216-2-1 to 216-2-3 at its downstream end side.

The branch pipes 216-1-1 and 216-2-1 have their downstream ends connected to two gas inlets 214-1*i*-1 and 214-1*i*-2 of the flow divider 214-1, respectively. The branch pipes 216-1-2 and 216-2-2 have their downstream ends connected to two gas inlets 114-2*i*-1 and 214-2*i*-2 of the flow divider 214-2, respectively. The branch pipes 216-1-3 and 216-2-3 have their downstream ends connected to two gas inlets 214-3*i*-1 and 214-3*i*-2 of the flow divider 214-1, respectively.

The branch pipes of the pipes 216-1 and 216-2 are provided with inlet-side air valves for opening and closing the branch pipes, respectively. More specifically, the branch pipes 216-1-1 and 216-2-1 are provided with inlet-side air valves AVi11 and AVi12, respectively. The branch pipes 216-1-2 and 216-2-2 are provided with inlet-side air valves AVi21 and AVi22, respectively. The branch pipes 216-1-3 and 216-2-3 are provided with inlet-side air valves AVi31 and AVi32, respectively. Note that, in the following description, these inlet-side air valves may be described as the inlet-side air valves AVi$xy$ (where x is an integer that satisfies $1 \leq x \leq 3$ and y is 1 or 2). Moreover, the inlet-side air valves may also be simply called air valves.

Moreover, pipes 220-1-1 to 220-1-3 have their upstream ends connected to the plurality of gas outlets 214-1*o*-1 to 214-1*o*-3 of the flow divider 214-1, respectively. The flow divider 214-1 is designed so as to have an equal branching ratio of the gas to the plurality of gas outlets 214-1*o*-1 to 214-1*o*-3. More specifically, the flow divider 214-1 is designed such that the gas introduced into the flow divider 214-1 through the pipes 216-1-1 and 216-2-1 is delivered into the pipes 220-1-1 to 220-1-3 with an equal branching ratio through the plurality of gas outlets 214-1*o*-1 to 214-1*o*-3.

The pipes 220-1-1 to 220-1-3 are provided with outlet-side air valves AVo11, AVo12, and AVo13 for opening and closing the pipes 220-1-1 to 220-1-3, respectively. Note that, instead of the outlet-side air valves AVo11, AVo12, and AVo13, check valves may be provided to prevent the gas from flowing back from the downstream side toward the flow divider 214-1 that is the upstream side in the pipes 220-1-1 to 220-1-3.

Moreover, pipes 220-2-1 to 220-2-3 have their upstream ends connected to the plurality of gas outlets 214-2*o*-1 to 214-2*o*-3 of the flow divider 214-2, respectively. The flow divider 214-2 is designed so as to have an equal branching ratio of the gas to the plurality of gas outlets 214-2*o*-1 to 214-2*o*-3. More specifically, the flow divider 214-2 is designed such that the gas introduced into the flow divider 214-2 through the pipes 216-1-2 and 216-2-2 is delivered into the pipes 220-2-1 to 220-2-3 with an equal branching ratio through the plurality of gas outlets 214-2*o*-1 to 214-2*o*-3.

The pipes 220-2-1 to 220-2-3 are provided with outlet-side air valves AVo21, AVo22, and AVo23 for opening and closing the pipes 220-2-1 to 220-2-3, respectively. Note that, instead of the outlet-side air valves AVo21, AVo22, and AVo23, check valves may be provided to prevent the gas from flowing back from the downstream side toward the flow divider 214-2 that is the upstream side in the pipes 220-2-1 to 220-2-3.

Moreover, pipes 220-3-1 to 220-3-3 have their upstream ends connected to the plurality of gas outlets 214-3*o*-1 to 214-3*o*-3 of the flow divider 214-3, respectively. The flow divider 214-3 is designed so as to have an equal branching ratio of the gas to the plurality of gas outlets 214-3o-1 to 214-3o-3. More specifically, the flow divider 214-3 is designed such that the gas introduced into the flow divider 214-3 through the pipes 216-1-3 and 216-2-3 is delivered into the pipes 220-3-1 to 220-3-3 with an equal branching ratio through the plurality of gas outlets 214-3o-1 to 214-3o-3.

The pipes 220-3-1 to 220-3-3 are provided with outlet-side air valves AVo31, AVo32, and AVo33 for opening and closing the pipes 220-3-1 to 220-3-3, respectively. Note that, instead of the outlet-side air valves AVo31, AVo32, and AVo33, check valves may be provided to prevent the gas from flowing back from the downstream side toward the flow divider 214-3 that is the upstream side in the pipes 220-3-1 to 220-3-3.

Note that, in the following description, the above outlet-side air valves may be described as the outlet-side air valves AVomn (where m is an integer that satisfies $1 \leq m \leq 3$ and n is an integer that satisfies $1 \leq n \leq 3$). Moreover, the outlet-side air valves may also be simply called air valves.

The pipes 220-1-1, 220-2-1, and 220-3-1 have their downstream ends connected in common to an upstream end of a pipe 222-1. The pipes 220-1-2, 220-2-2, and 220-3-2 have their downstream ends connected in common to an upstream end of a pipe 222-2. The pipes 220-1-3, 220-2-3, and 220-3-3 have their downstream ends connected in common to an upstream end of a pipe 222-3.

The pipe 222-1 has its downstream end connected to the burner 210-1, so that the burner 210-1 is supplied with a gas through the pipe 222-1. The pipe 222-2 has its downstream end connected to the burner 210-2, so that the burner 210-2 is supplied with a gas through the pipe 222-2. The pipe 222-3 has its downstream end connected to the burner 210-3, so that the burner 210-3 is supplied with a gas through the pipe 222-3.

Thus, the plurality of gas outlets of each of the plurality of flow dividers 214-1 to 214-3 are connected in 1:1 through the pipes to any of the plurality of burners 210-1 to 210-3. More specifically, the gas outlet 214-1o-1 of the flow divider 214-1 is connected to the burner 210-1 through the pipes 220-1-1 and 222-1. The gas outlet 214-1o-2 of the flow divider 214-1 is connected to the burner 210-2 through the pipes 220-1-2 and 222-2. The gas outlet 214-1o-3 of the flow divider 214-1 is connected to the burner 210-3 through the pipes 220-1-3 and 222-3. The gas outlet 214-2o-1 of the flow divider 214-2 is connected to the burner 210-1 through the pipes 220-2-1 and 222-1. The gas outlet 214-2o-2 of the flow divider 214-2 is connected to the burner 210-2 through the pipes 220-2-2 and 222-2. The gas outlet 214-2o-3 of the flow divider 214-2 is connected to the burner 210-3 through the pipes 220-2-3 and 222-3. The gas outlet 214-3o-1 of the flow divider 214-3 is connected to the burner 210-1 through the pipes 220-3-1 and 222-1. The gas outlet 214-3o-2 of the flow divider 214-3 is connected to the burner 210-2 through the pipes 220-3-2 and 222-2. The gas outlet 214-3o-3 of the flow divider 214-3 is connected to the burner 210-3 through the pipes 220-3-3 and 222-3.

The gas branching apparatus 2100 according to this embodiment further includes a controller 224 configured to control opening and closing of the inlet-side air valves AVixy and the outlet-side air valves AVomn. The controller 224 includes a CPU (not shown) configured to execute various kinds of processing such as calculation, control, and determination. The controller 224 also includes a ROM (not shown) configured to store various control programs to be executed by the CPU, a database to be referred to by the CPU, and the like. The controller 224 further includes a RAM (not shown) configured to temporarily store data that is being processed by the CPU, input data, and the like.

The controller 224 controls opening and closing of the inlet-side air valves AVixy and the outlet-side air valves AVomn so as to switch the flow divider to be used to branch the gas to any of the flow dividers 214-1 to 214-3 during manufacturing of the fine glass particle deposited body using the flames from the burners 210-1 to 210-3. As to switching of the flow divider to be used, the controller 224 controls opening and closing of the inlet-side air valves AVi11 and AVi12 and the outlet-side air valves AVo11, AVo12, and AVo13 in synchronization with the flow divider 214-1. The controller 224 controls opening and closing of the inlet-side air valves AVi21 and AVi22 and the outlet-side air valves AVo21, AVo22, and AVo23 in synchronization with the flow divider 214-2. The controller 224 controls opening and closing of the inlet-side air valves AVi31 and AVi32 and the outlet-side air valves AVo31, AVo32, and AVo33 in synchronization with the flow divider 214-3. Moreover, the controller 224 sets any one of the groups of the air valves to be controlled in synchronization, including the group of the air valves AVi11, AVi12, AVo11, AVo12, and AVo13, the group of the air valves AVi21, AVi22, AVo21, AVo22, and AVo23, and the group of the air valves AVi31, AVi32, AVo31, AVo32, and AVo33 to the opened state, and the rest of the groups to the closed state.

The controller 224 acquires a flow rate of the gas to be branched from the MFCs 218-1 and 218-2, and executes the switching of the flow divider described above according to the flow rate of the gas to be branched. More specifically, the controller 224 switches the flow divider to be used to branch the gas to the small-volume flow divider 214-1 when the flow rate of the gas to be branched is the low flow rate. The controller 224 switches the flow divider to be used to branch the gas to the medium-volume flow divider 214-2 when the flow rate of the gas is the medium flow rate, which is higher than the low flow rate. The controller 224 switches the flow divider to be used to branch the gas to the large-volume flow divider 214-3 when the flow rate of the gas is the high flow rate, which is higher than the medium flow rate.

Note that the flow rates of the gas using the flow dividers 214-1 to 214-3 are not particularly limited. For example, when the flow rate of the gas to be branched is the low flow rate of 3000 to 5000 sccm, the small-volume flow divider 214-1 having a volume of 500 to 1000 $cm^3$ can be used. When the flow rate of the gas to be branched is the medium flow rate of 5000 to 8000 sccm, the medium-volume flow divider 214-2 having a volume of 1000 to 2000 $cm^3$ can be used. When the flow rate of the gas to be branched is the high flow rate of 8000 to 10000 sccm, the large-volume flow divider 214-3 having a volume of 2000 to 3000 $cm^3$ can be used.

The gas is supplied to the respective burners 210-1 to 210-3 while changing the flow rate with the passage of time from the start of manufacturing of one fine glass particle deposited body to the end of manufacturing. For example, from the start to the end of manufacturing, the gas is supplied to the burners 210-1 to 210-3 such that the flow rate is gradually increased over time. Thus, the flow rate of the gas to be branched is also changed over time, for example, gradually increased. In the gas branching apparatus 2100 according to this embodiment, the flow divider to be used to branch the gas is switched to any of the flow dividers 214-1 to 214-3 according to the flow rate of the gas, which is changed in such a manner. Note that the mode in which the flow rate of the gas is changed is not particularly limited.

Besides the mode in which the flow rate is gradually increased over time, for example, a mode in which the flow rate is gradually decreased over time, a mode in which the flow rate is gradually increased or gradually decreased over time, a mode in which the flow rate is increased and decreased over time, or a combination of these modes may be adopted.

As for manufacturing of the fine glass particle deposited body for optical fiber, the flow rate of the gas to be supplied to the plurality of burners may be changed. Thus, the flow rate of the gas to be branched by the flow divider is also changed. However, when the volume of the flow divider is not appropriate, i.e., too small or too large, with respect to the flow rate of the gas, inconvenience occurs, such as difficulty with equal branching.

To be more specific, first, when the gas to be branched has a high flow rate, influences of dynamic pressure are increased if the volume of the flow divider is too small. Therefore, a flow divider having a structure in which an outlet side flow path is narrowed generally results in difficulty with equal branching. On the other hand, when the gas to be branched has a low flow rate, it takes time before the pressure inside the flow divider is equalized if the volume of the flow divider is too large. This delays a change in flow rate on the outlet side, making equal branching difficult.

For this reason, when the flow rate of the gas to be branched is changed, such a flow rate may make the branching ratio of the flow divider unstable. Such an unstable branching ratio of the flow divider makes it difficult to supply the gas to the plurality of burners with high uniformity. As a result, uniformity and stability of the fine glass particle deposited body in its longitudinal direction, which is manufactured along the longitudinal direction of the core material, may be impaired.

To counter this, in the gas branching apparatus 2100 according to this embodiment, the controller 224 switches the flow divider to be used to branch the gas among the flow dividers 214-1 to 214-3 having different volumes according to the flow rate of the gas to be branched. By switching the flow divider according to the flow rate of the gas to be branched as described above, a more appropriate flow divider can be used according to the flow rate of the gas to be branched. Thus, the gas can be stably branched and supplied to the burners 210-1 to 210-3 with high uniformity while reducing the influences of the flow rate. Therefore, according to this embodiment, a fine glass particle deposited body excellent in uniformity and stability in the longitudinal direction can be manufactured.

Next, with reference to FIG. 6, description is further given of operations of the gas branching apparatus 2100 according to this embodiment.

Before the gas branching apparatus 2100 starts its operation, the inlet-side air valves AVixy and the outlet-side air valves AVomn are all set in the closed state.

First, the gas branching apparatus 2100 starts its operation, thereby introducing a gas into the flow dividers 214-1 to 214-3 through the pipes 216-1 and 216-2. During the introduction of the gas through the pipes 216-1 and 216-2, the MFCs 218-1 and 218-2 control the flow rates of the gases flowing through the pipes 216-1 and 216-2, respectively.

The controller 224 acquires the flow rate of the gas to be branched from the MFCs 218-1 and 218-2 (Step S211).

Next, the controller 224 determines whether or not the flow rate acquired from the MFCs 218-1 and 218-2 is not more than a flow rate value f1 that is an upper limit for the use of the small-volume flow divider 214-1 (Step S212).

When the flow rate is not more than the flow rate value f1 (Step S212, YES), the controller 224 sets the group of the air valves AVi11, AVi12, AVo11, AVo12, and AVo13 to the opened state. At the same time, the controller 224 sets the group of the air valves AVi21, AVi22, AVo21, AVo22, and AVo23 and the group of the air valves AVi31, AVi32, AVo31, AVo32, and AVo33 to the closed state. Thus, the small-volume flow divider 214-1 is set as the flow divider to be used to branch the gas (Step S213).

On the other hand, when the flow rate is more than the flow rate value f1 (Step S212, NO), the controller 224 determines whether or not the flow rate acquired from the MFCs 218-1 and 218-2 is not more than a flow rate value f2 that is an upper limit for the use of the medium-volume flow divider 214-2 (Step S214). Note that the flow rate value f2 is larger than the flow rate value f1. When the flow rate is not more than the flow rate value f2 (Step S214, YES), the controller 224 sets the group of the air valves AVi21, AVi22, AVo21, AVo22, and AVo23 to the opened state. At the same time, the controller 224 sets the group of the air valves AVi11, AVi12, AVo11, AVo12, and AVo13 and the group of the air valves AVi31, AVi32, AVo31, AVo32, and AVo33 to the closed state. Thus, the medium-volume flow divider 214-2 is set as the flow divider to be used to branch the gas (Step S215).

On the other hand, when the flow rate is more than the flow rate value f2 (Step S214, NO), the controller 224 sets the group of the air valves AVi31, AVi32, AVo31, AVo32, and AVo33 to the opened state. At the same time, the controller 224 sets the group of the air valves AVi11, AVi12, AVo11, AVo12, and AVo13 and the group of the air valves AVi21, AVi22, AVo21, AVo22, and AVo23 to the closed state. Thus, the large-volume flow divider 214-3 is set as the flow divider to be used to branch the gas (Step S216).

After setting the flow divider to be used to branch the gas according to the flow rate of the gas as described above, the gas is branched by the set flow divider and supplied to the plurality of burners 210-1 to 210-3, respectively (Step S217). Note that other gases used to manufacture a fine glass particle deposited body are similarly supplied to the plurality of burners 210-1 to 210-3.

In the respective burners 210-1 to 210-3 supplied with the gases as described above, flames are formed using a fuel gas among the gases supplied, and a raw gas among the gases supplied is introduced into the flames. Thus, the flames containing the raw material are blown onto the core material 112 rotated with its central axis as a rotation axis. Accordingly, fine glass particles to be a preform of optical fiber are sequentially deposited on the core material 212. Note that, in the meantime, the plurality of burners 210-1 to 210-3 may be moved back and forth along the longitudinal direction of the core material 112.

During the deposition of the fine glass particles on the core material 212 as described above, the deposition weight of the fine glass particles deposited on the core material 212 is monitored, and it is determined based on the monitored deposition weight whether or not to terminate the deposition of the fine glass particles (Step S218).

When the deposition weight of the fine glass particles is less than a predetermined weight and the deposition is continued rather than being terminated (Step S218, NO), the processing returns to Step S211 to continue the deposition of the fine glass particles by supplying the respective gases while switching the flow divider according to the flow rate of the gas as described above.

On the other hand, when the deposition weight of the fine glass particles is the predetermined weight and thus the deposition is to be terminated (Step 5218, YES), the controller 124 sets all the inlet-side air valves AVixy and the outlet-side air valves AVomn in the closed state (Step S219). Thus, the deposition of the fine glass particles on the core material 212 is terminated to obtain a fine glass particle deposited body that is a deposition of the glass particles.

Thereafter, the fine glass particle deposited body thus obtained is dehydrated and sintered in a furnace to obtain a preform.

As described above, according to this embodiment, gases can be supplied to a plurality of supply targets with high uniformity.

Note that the above description is given of the case where the flow dividers 214-1 to 214-3 are switched thereamong during the manufacturing of one fine glass particle deposited body. Meanwhile, in the case of manufacturing different kinds of fine glass particle deposited bodies different in size, material composition, and the like, the flow rates of the gases to be supplied to the burners may also be different, and the flow rates of the gases to be branched may also be different. In such a case of manufacturing different kinds of fine glass particle deposited bodies different in size and the like, the flow dividers 214-1 to 214-3 to be used to branch the gas can also be switched and used according to the kind of the fine glass particle deposited body. Thus, in the case of manufacturing different kinds of fine glass particle deposited bodies, again, stable branching of the gas can be realized during manufacturing of the respective fine glass particle deposited bodies.

[Seventh Embodiment]

Figure 7:
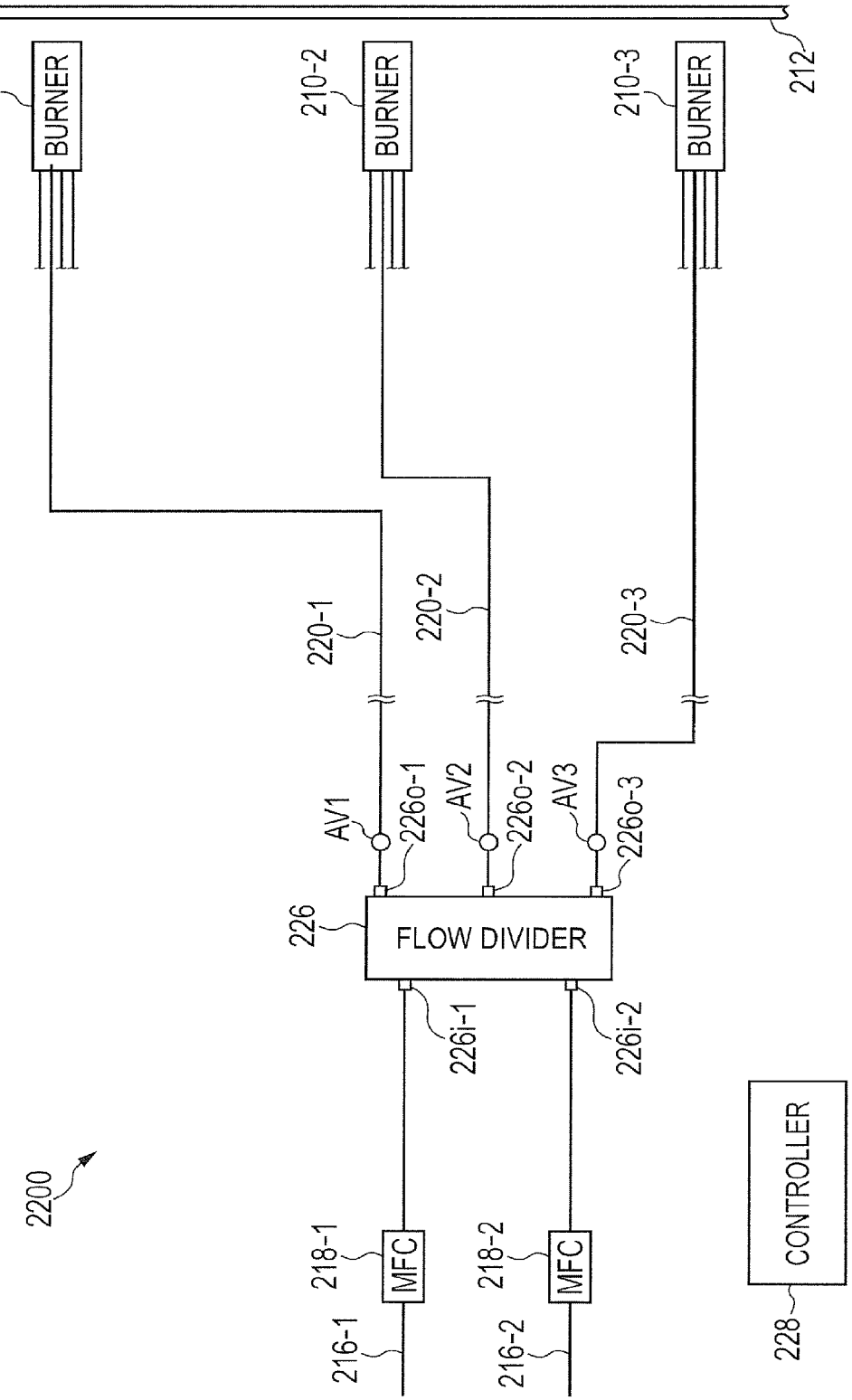
FIG. 7 is a schematic diagram showing a gas branching apparatus according to a seventh embodiment of the present invention.

With reference to FIG. 7, description is given of a gas branching apparatus according to a seventh embodiment of the present invention. Note that the same constituent components as those in the gas branching apparatus according to the sixth embodiment described above are denoted by the same reference numerals, and description thereof is omitted or simplified.

In the sixth embodiment, the description is given of, as an example, the case where the plurality of flow dividers 214-1 to 214-3 having different volumes are used. However, the plurality of flow dividers 214-1 to 214-3 do not always have to be used if the volume of the flow divider to be used to branch the gas can be changed. More specifically, the use of a volume-variable flow divider can realize stable branching of the gas while reducing the influences of the flow rate, as in the case of using the plurality of flow dividers 214-1 to 214-3.

In this embodiment, description is given of the case using a single volume-variable flow divider instead of the plurality of flow dividers 214-1 to 214-3 having different volumes.

As shown in FIG. 7, a gas branching apparatus 2200 according to this embodiment includes a volume-variable flow divider 226 configured to branch a gas to be supplied to a plurality of burners 210-1 to 210-3. Also, the gas branching apparatus 2200 according to this embodiment includes a piping system for supplying the gas to the flow divider 226 and a piping system for connecting between the flow divider 226 and the plurality of burners 210-1 to 210-3.

The flow divider 226 is made of metal, for example, and has a volume varying mechanism capable of changing its volume. A configuration of the volume varying mechanism is not particularly limited as long as the volume of the flow divider 226 can be changed. Note that the volume of the volume-variable flow divider 226 is controlled by a controller 228.

The flow divider 226 includes two gas inlets 226i-1 and 226i-2 and a plurality of gas outlets 226o-1 to 226o-3, which are the same in number as the plurality of burners 210-1 to 210-3. The plurality of gas outlets 226o-1 to 226o-3 are provided at equal intervals in a certain array direction. The flow divider 226 is disposed such that the array direction of the plurality of gas outlets 226o-1 to 226o-3 is horizontal as in the case of the longitudinal direction of the core material 212, for example.

Note that the volume variable range of the flow divider 226 is not particularly limited, and can be selected according to gas supply conditions and the like. For example, the volume of the flow divider 226 can be changed within the range of 500 to 3000 $cm^3$. Moreover, while the description is given of the case where the flow divider 226 includes the two gas inlets 226i-1 and 226i-2, the number of the gas inlets is not limited to 2. The number of the gas inlets may be one or two or more, and can be changed as needed according to the volume variable range of the flow divider 226, and the like.

The gas branching apparatus 2200 according to this embodiment includes pipes 216-1 and 216-2 for supplying the flow divider 226 with the same kind of gas as that to be supplied to the burners 210-1 to 210-3. The pipes 216-1 and 216-2 have their upstream ends connected to a supply source (not shown) of the gas to be supplied to the burners 210-1 to 210-3. The pipes 216-1 and 216-2 are provided with MFCs 218-1 and 218-2, respectively. The MFCs 218-1 and 218-2 enable control of flow rates of gases flowing toward the flow dividers 214-1 to 214-3 through the pipes 216-1 and 216-2.

The pipes 216-1 and 216-2 have their downstream ends connected to two gas inlets 226i-1 and 226i-2 of the flow divider 226, respectively.

Moreover, the pipes 220-1 to 220-3 have their upstream ends connected to the plurality of gas outlets 226o-1 to 226o-3 of the flow divider 226, respectively. The flow divider 226 is designed so as to have an equal branching ratio of the gas to the plurality of gas outlets 226o-1 to 226o-3 within the volume variable range. More specifically, the flow divider 226 is designed such that the gas introduced into the flow divider 226 through the pipes 216-1 and 216-2 is delivered into the pipes 220-1 to 220-3 with an equal branching ratio through the plurality of gas outlets 226o-1 to 226o-3.

The pipes 220-1 to 220-3 are provided with air valves AV1 to AV3 for opening and closing the pipes 220-1 to 220-3, respectively.

The pipe 220-1 has its downstream end connected to the burner 210-1, so that the burner 210-1 is supplied with a gas through the pipe 220-1. The pipe 220-2 has its downstream end connected to the burner 210-2, so that the burner 210-2 is supplied with a gas through the pipe 220-2. The pipe 220-3 has its downstream end connected to the burner 210-3, so that the burner 210-3 is supplied with a gas through the pipe 220-3.

The gas branching apparatus 2200 according to this embodiment further includes the controller 228 configured to control opening and closing of the air valves AV1 to AV3 and to control the volume of the volume-variable flow divider 226. The controller 228 includes a CPU (not shown) configured to execute various kinds of processing such as calculation, control, and determination. The controller 228 also includes a ROM (not shown) configured to store various control programs to be executed by the CPU, a database to be referred to by the CPU, and the like. The controller 228 further includes a RAM (not shown) configured to temporarily store data that is being processed by the CPU, input data, and the like.

During manufacturing of a fine glass particle deposited body using flames from the burners 210-1 to 210-3, the controller 228 sets the air valves AV1 to AV3 in the opened state and controls the volume of the volume-variable flow divider 226 according to the flow rate of the gas to be branched by the flow divider 226.

The controller 228 acquires a flow rate of the gas to be branched from the MFCs 218-1 and 218-2 to control the volume of the flow divider 226 according to the flow rate of the gas to be branched. More specifically, the controller 228 sets the volume of the flow divider 226 to a relatively small value when the flow rate of the gas to be branched is relatively low. On the other hand, the controller 228 sets the volume of the flow divider 226 to a relatively large value when the flow rate of the gas to be branched is relatively high.

Note that the volume range of the flow divider 226 set by the controller 228 is not particularly limited. For example, when the flow rate of the gas is the low flow rate of 3000 to 5000 sccm, the volume of the flow divider 226 can be set to a small volume value of 500 to 1000 cm$^3$. When the flow rate of the gas is the medium flow rate of 5000 to 8000 sccm, the volume of the flow divider 226 can be set to a medium volume value of 1000 to 2000 cm$^3$. When the flow rate of the gas is the high flow rate of 8000 to 10000 sccm, the volume of the flow divider 226 can be set to a large volume value of 2000 to 3000 cm$^3$.

By changing the volume of the flow divider 226 according to the flow rate of the gas to be branched as described above, the volume of the flow divider 226 can be set to a more appropriate value according to the flow rate of the gas to be branched. Thus, the gas can be stably branched and supplied to the burners 210-1 to 210-3 with high uniformity while reducing the influences of the flow rate, as in the case of the sixth embodiment. Therefore, according to this embodiment, a fine glass particle deposited body excellent in uniformity and stability in the longitudinal direction can be manufactured.

The present invention is not limited to the sixth and seventh embodiments described above, but various modifications can be made thereto.

For example, in the sixth and seventh embodiments, the description is given of, as an example, the case where the gas is branched and supplied into the three burners 210-1 to 210-3. However, the number of the burners is not particularly limited as long as two or more burners are provided. Moreover, the description is given of, as an example, the case where the gas branching apparatus 2100 includes the three flow dividers 214-1 to 214-3 having different volumes. However, the number of the flow dividers having different volumes is not particularly limited as long as two or more flow dividers are provided. It is preferable, however, that the number of the flow dividers is 10 or less to prevent the apparatus from becoming complex.

When a gas is branched and supplied into first to N-th (where N is an integer of 2 or more) burners, a plurality of flow dividers are used. The flow dividers each include first to N-th gas outlets through which the gas is branched and discharged, and are designed so as to have an equal branching ratio of the gas to the first to N-th gas outlets. The plurality of flow dividers have different volumes each other. The first to N-th gas outlets of the plurality of flow dividers are connected in 1:1 through a plurality of pipes to any of the first to N-th burners.

When the gas is branched and supplied to the first to N-th burners described above, the controller may switch the flow divider to be used to branch the gas so as to use any one of the plurality of flow dividers for branching of the gas according to the flow rate of the gas.

Moreover, instead of the plurality of flow dividers, a volume-variable flow divider can also be used. The volume-variable flow divider includes first to N-th gas outlets through which the gas is branched and discharged, and is designed so as to have an equal branching ratio of the gas to the first to N-th gas outlets. The first to N-th gas outlets of the volume-variable flow divider are connected in 1:1 through a plurality of pipes to any of the first to N-th burners.

When the volume-variable flow divider described above is used, the controller may control the volume of the flow divider according to the flow rate of the gas.

Moreover, in the sixth and seventh embodiments, the description is given of, as an example, the case where the burners 210-1 to 210-3 are used as a plurality of supply targets to be supplied with the gas. However, the supply targets are not limited to the burners. The supply targets may be those subjected to some kind of processing, such as manufacturing of products and processing on processed products, using the supplied gas.

Moreover, in the sixth and seventh embodiments, the description is given of, as an example, the case where the burners 210-1 to 210-3 as the supply targets are arranged along the longitudinal direction of the core material 212 that is the object. However, the plurality of supply targets do not always have to be those arranged along the longitudinal direction of the object.

Moreover, in the sixth and seventh embodiments, the description is given of, as an example, the case using the air valves AVixy, AVomn, and AV1 to AV3. However, instead of the air valves, various valves can be used, whose opening and closing can be controlled by the controllers 224 and 228. For example, electromagnetic valves or the like can be used instead of the air valves.

Moreover, in the sixth and seventh embodiments, the description is given of, as an example, the case where the flow divider to be used to branch the gas is switched by controlling the opening and closing of the air valves. A method for switching the flow divider is not limited thereto. Various other methods can be used to switch the flow divider to be used to branch the gas.

Moreover, in the sixth and seventh embodiments, the description is given of, as an example, the case where the core material 212 is held such that the longitudinal direction thereof is horizontal. However, the mode of holding the core material 212 is not limited thereto. For example, the core material 212 may be held such that the longitudinal direction thereof is vertical. In this case, the burners 210-1 to 210-3 are arranged at equal intervals along the longitudinal direction of the core material 212 that is vertically disposed. Moreover, the flow dividers 214-1 to 214-3 may be horizontally arranged as described above, or may be vertically arranged.

Moreover, in the sixth and seventh embodiments, the description is given of, as an example, the case where the number of the plurality of burners 210-1 to 210-3 is the same as the number of the plurality of flow dividers 214-1 to 214-3. However, the numbers thereof do not always have to be the same. The number of the plurality of flow dividers having different volumes can be set according to the flow rate range of the gas to be branched.

Moreover, the sixth and seventh embodiments are also applicable to the case where the branching ratio of the flow divider is not even.

What is claimed is:

1. A gas branching apparatus that branches and supplies a gas to first to N-th supply targets (where N is an integer of 2 or more), comprising:
   a controller; and
   first to N-th pipes,
   wherein the first to N-th pipes are each branched into first to N-th branch pipes on a downstream end side,
   wherein the i-th branch pipes of the respective first to N-th pipes are connected in common to the i-th supply target, and the i-th branch pipes of the respective first to N-th pipes are provided with respective valves, where i denotes each of integers of 1 to N,
   wherein the gas branching apparatus is arranged between a mass flow controller and the first N-th supply targets,
   wherein the controller is configured to control opening and closing of the valves provided on the first to N-th branch pipes of the first to N-th pipes, and
   wherein the controller controls the opening and closing of the valves while satisfying a first condition where one of the N valves provided on the first to N-th branch pipes of the j-th pipe is set to an opened state and the rest are set to a closed state, where j notes each of integers of 1 to N, and satisfying a second condition where one of the N valves provided on the k-th branch pipes of the respective first to N-th pipes is set to the opened state and the rest are set to the closed state, where k denotes each of integers of 1 to N.

2. The gas branching apparatus according to claim 1, wherein
   the controller controls the opening and closing of the valves so as to randomly switch the opened and closed states of the valves.

3. The gas branching apparatus according to claim 1, wherein
   the controller controls opening and closing of the valves so as to regularly switch the opened and closed states of the valves.

4. The gas branching apparatus according to claim 1, further comprising:
   a flow divider provided upstream of the first to N-th pipes,
   wherein the flow divider includes first to N-th gas outlets through which the gas is branched and discharged, and upstream ends of the first to N-th pipes are connected to the first to N-th gas outlets, respectively.

5. The gas branching apparatus according to claim 4, wherein the flow divider is designed so as to have an equal branching ratio of the gas to the first to N-th gas outlets.

6. The gas branching apparatus according to claim 1, wherein the first to N-th supply targets are arranged along a longitudinal direction of a long object.

* * * * *